(12) United States Patent
Lilak et al.

(10) Patent No.: US 11,374,004 B2
(45) Date of Patent: Jun. 28, 2022

(54) PEDESTAL FIN STRUCTURE FOR STACKED TRANSISTOR INTEGRATION

(71) Applicant: INTEL CORPORATION, Santa Clara, CA (US)

(72) Inventors: Aaron D. Lilak, Beaverton, OR (US); Rishabh Mehandru, Portland, OR (US); Anh Phan, Beaverton, OR (US); Gilbert Dewey, Beaverton, OR (US); Willy Rachmady, Beaverton, OR (US); Stephen M. Cea, Hillsboro, OR (US); Sayed Hasan, Portland, OR (US); Kerryann M. Foley, Hillsboro, OR (US); Patrick Morrow, Portland, OR (US); Colin D. Landon, Portland, OR (US); Ehren Mannebach, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 852 days.

(21) Appl. No.: 16/024,064

(22) Filed: Jun. 29, 2018

(65) Prior Publication Data
US 2020/0006340 A1  Jan. 2, 2020

(51) Int. Cl.
*H01L 27/092* (2006.01)
*H01L 27/12* (2006.01)
(Continued)

(52) U.S. Cl.
CPC ...... *H01L 27/0922* (2013.01); *H01L 27/1211* (2013.01); *H01L 29/42392* (2013.01); *H01L 29/775* (2013.01); *H01L 29/785* (2013.01)

(58) Field of Classification Search
CPC .............. H01L 27/0922; H01L 27/1211; H01L 29/42392; H01L 29/775; H01L 29/785;
(Continued)

(56) References Cited

U.S. PATENT DOCUMENTS 5,612,552 A * 3/1997 Owens ................ H01L 27/0688
                                                        257/202
9,691,851 B1   6/2017 Fung
(Continued)

FOREIGN PATENT DOCUMENTS

| WO | 2016204755 A1 | 12/2016 |
| WO | 2017095409 A1 | 6/2017 |
| WO | 2018039645 A1 | 3/2018 |

OTHER PUBLICATIONS

Extended European Search Report received for EP Application No. 19176628.6-1230, dated Nov. 15, 2019. 7 pages.

*Primary Examiner* — Jonathan Han
(74) *Attorney, Agent, or Firm* — Schwabe, Williamson & Wyatt, P.C.

(57) ABSTRACT

Stacked transistor structures and methods of forming same. In an embodiment, a stacked transistor structure has a wide central pedestal region and at least one relatively narrower channel region above and/or below the wider central pedestal region. The upper and lower channel regions are configured with a non-planar architecture, and include one or more semiconductor fins, nanowires, and/or nanoribbons. The top and bottom channel regions may be configured the same or differently, with respect to shape and/or semiconductor materials. In some cases, an outermost sidewall of one or both the top and/or bottom channel region structures, is collinear with an outermost sidewall of the wider central pedestal region. In some such cases, the outermost sidewall of the top channel region structure is collinear with the outermost sidewall of the bottom channel region structure. Top and bottom transistor structures (NMOS/PMOS) may be formed using the top and bottom channel region structures.

23 Claims, 18 Drawing Sheets

(51) Int. Cl.
*H01L 29/423* (2006.01)
*H01L 29/775* (2006.01)
*H01L 29/78* (2006.01)

(58) Field of Classification Search
CPC ..... H01L 21/823412; H01L 21/823807; H01L 27/0688; H01L 27/092; H01L 29/66545; H01L 27/0694; H01L 27/0886; H01L 29/0673; H01L 29/66439; H01L 29/78696; H01L 21/823821; H01L 27/0924; H01L 21/823431; B82Y 10/00
See application file for complete search history.

(56) References Cited

U.S. PATENT DOCUMENTS

| | | | |
|---|---|---|---|
| 2013/0193550 A1* | 8/2013 | Sklenard | H01L 27/0688 257/508 |
| 2014/0027860 A1 | 1/2014 | Glass et al. | |
| 2015/0061026 A1* | 3/2015 | Lin | H01L 27/0207 257/369 |
| 2015/0243733 A1 | 8/2015 | Yang et al. | |
| 2015/0370947 A1 | 12/2015 | Moroz et al. | |
| 2016/0260802 A1 | 9/2016 | Glass et al. | |
| 2018/0156749 A1 | 6/2018 | Rozeau et al. | |
| 2019/0131396 A1* | 5/2019 | Zhang | H01L 21/30604 |

\* cited by examiner

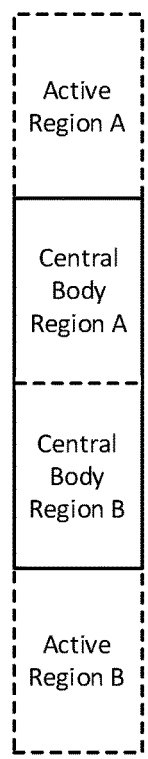 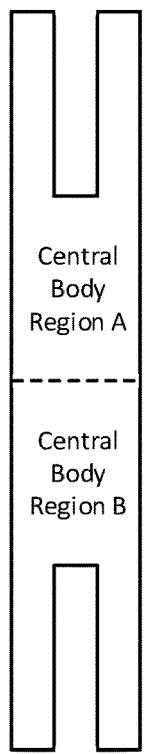 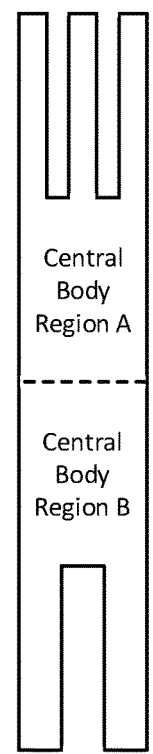 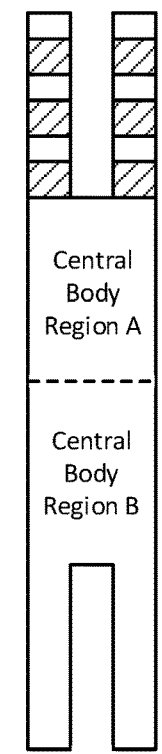 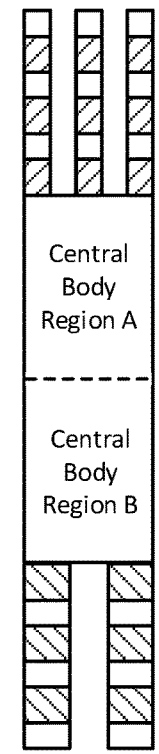
Fig. 2a  Fig. 2b  Fig. 2c  Fig. 2d  Fig. 2e
    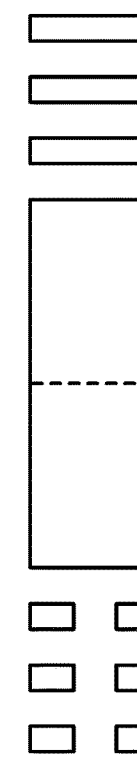
Fig. 2f  Fig. 2g  Fig. 2h  Fig. 2i  Fig. 2i'

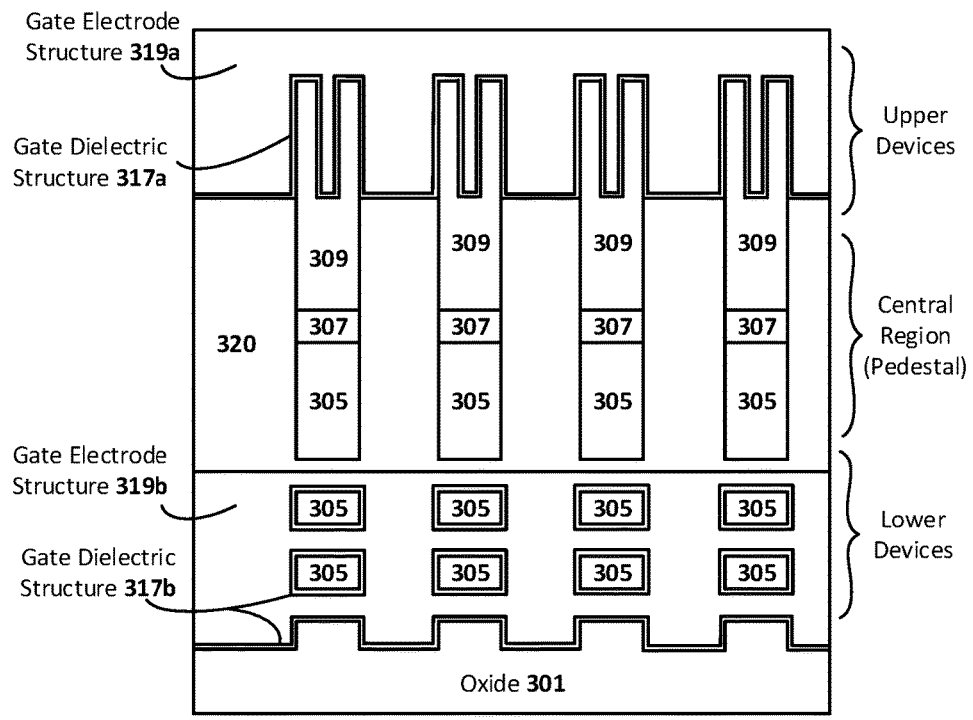
Fig. 3k
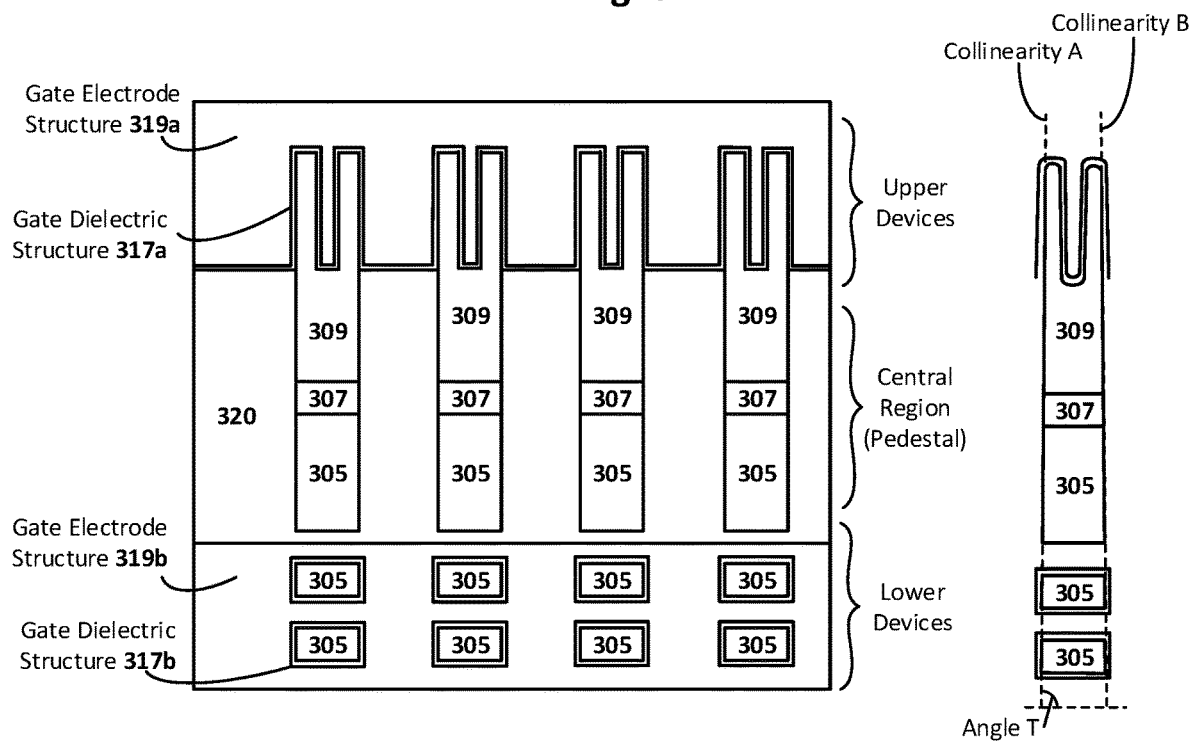
Fig. 3l
Fig. 3l'

PEDESTAL FIN STRUCTURE FOR STACKED TRANSISTOR INTEGRATION

BACKGROUND

Integrated circuitry continues to scale to smaller feature dimensions and higher transistor densities. A more recent development with respect to increasing transistor density is generally referred to as three-dimensional (3D) integration, which expands transistor density by exploiting the Z-dimension (build upwards rather than laterally outwards in the X and Y dimensions). Some such 3D integrated circuits are monolithic in nature, in that they are formed utilizing a technique known as layer transfer. Such layer transfer may include, for instance, bond and hydrogen-based or hydrogen/helium based cleave techniques. Another means of performing layer transfer is to bond (such as with an oxide) two distinct wafers (sometimes referred to as host and donor wafers or substrates) and then perform a chemical-mechanical polish (CMP) operation to remove bulk of the bonded wafer leaving only a relatively thin region on the host wafer. This bond and polish operation may also utilize an etchstop embedded within the donor wafer. In any such cases, such 3D integration schemes give rise to a number of non-trivial issues which can cause degraded device performance and reliability.

BRIEF DESCRIPTION OF THE DRAWINGS

FIGS. 2a through 2i' illustrate cross-section views of example channel region configurations of a stacked transistor structure having a wide central pedestal region and at least one narrow channel region above and/or below the pedestal region, in accordance with various embodiments of the present disclosure. The cross-section is taken parallel to and through the gate line of the structure, although the gate line is not shown, so as to allow focus on the channel region configurations (e.g., fins, nanowires, nanoribbons above and below the central portion).

Figure 1A:
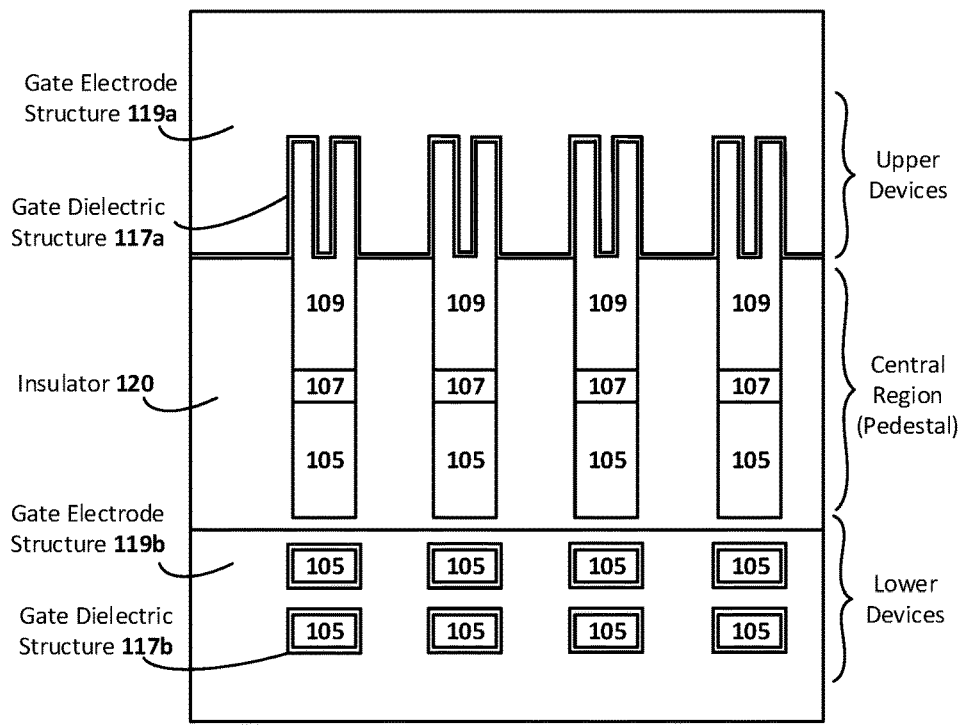
FIG. 1a illustrates a cross-section view of an integrated circuit including a stacked transistor structure having a wide central pedestal region and at least one narrow channel region above and/or below the pedestal region, in accordance with an embodiment of the present disclosure. The cross-section is taken parallel to and through the gate line of the structure.

As will be appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles, and some features may have surface topology or otherwise be non-smooth, given real world limitations of the processing equipment and techniques used.

DETAILED DESCRIPTION

Stacked transistor structures and methods of forming same are disclosed. In an embodiment, a stacked transistor structure has a wide central pedestal region and at least one relatively narrower channel region above and/or below the wider central pedestal region. The upper and lower channel regions are configured with a non-planar architecture and include one or more semiconductor fins, nanowires, and/or nanoribbons. The top and bottom channel regions may be configured the same or differently, with respect to shape and/or semiconductor materials. In any such cases, and according to some embodiments, the outer most sidewalls of the top and bottom channel regions, whether configured as fins, wires, and/or ribbons, may be vertically or linearly aligned with the sidewalls of the wider central pedestal and possibly with each other, depending on the forming techniques used, as will be appreciated in light of this disclosure. In this sense, the outer sidewalls of the outermost fins, wires, and/or nanowires of the top and bottom channel regions are collinear with the sidewalls of the wider central region, and possibly with each other. In any such cases, the resulting structure having top and bottom channel regions can be processed to form top and bottom transistor structures using, for instance, gate-first or gate-last processing, as well as etch-and-replace epitaxial source and drain region processing. Various advantages of the techniques provided herein will be appreciated, particularly with respect to mechanical stability, the ease and efficacy to which the stacked structure may be doped with impurities to provide isolation between top and bottom transistor structures, and improved self-heat resistance, according to some embodiments. As will be further appreciated, a structure configured in accordance with some embodiments also greatly eases the integration of nanoribbon structures for one device layer (e.g., bottom transistor) with fins or nanowires for the other device layer (e.g., top transistors).

Note that in embodiments having collinearity of the outer most sidewalls of the top and/or bottom channel regions with the sidewalls of the central region do not require a perfectly vertical or straight line (straight up and down, or 90°). Rather, the line with which the various sidewalls align may, for instance, slope or curve inward (taper) at an angle in the range of, for example, of 80° to 89.9°. Further note that the outer sidewalls of the outermost fins, wires, and/or nanowires of the top channel region may be collinear with the sidewall of the wider central portion, and the outer sidewalls of the outermost fins, wires, and/or nanowires of the bottom channel region may also be collinear with the sidewalls of the wider central portion, but those same outer sidewalls of the top and bottom channel regions may not be collinear with each other. Numerous configurations and permutations will be apparent in light of this disclosure.

Note that embodiments according to the present disclosure, including those where the outer most sidewalls of the top and/or bottom channel regions are collinear with the sidewalls of the central region, do not require perfectly vertical or straight sidewalls (straight up and down, or) 90°. For instance, the line with which the various sidewalls align (when collinearity is present) may, for instance, slope or curve inward (taper) at an angle in the range of, for example, of 80° to 89.9°. Further note that the outer sidewalls of the outermost fins, wires, and/or nanowires of the top channel region may be collinear with the sidewall of the wider central portion, and the outer sidewalls of the outermost fins, wires, and/or nanowires of the bottom channel region may also be collinear with the sidewalls of the wider central portion, but those same outer sidewalls of the top and bottom channel regions may not be collinear with each other. Numerous configurations and permutations will be apparent in light of this disclosure.

General Overview

As previously explained, 3D integration schemes give rise to a number of non-trivial issues which can cause degraded device performance and reliability. For instance, existing solutions utilize bonding of separately formed fin structures or monolithic stacking of narrow fins/wires/ribbon structures. The resulting structures effectively have a uniform thickness (not counting any tapering resulting from the formation process) from the top channel region to the bottom channel region. There is no intervening wider central portion, or diversity in channel configuration or materials. Nor is there a direct means to vertically or linearly align, for instance, bottom nanoribbon structures with top fin or nanowire structures (or other such top and bottom non-planar transistor configurations). Moreover, existing solutions are less resilient to mechanical forces and are more prone to issues such as fin collapse and bending, less easily doped for isolation (if necessary), and less resilient to self-heat behaviors.

Thus, stacked transistor structures and methods of forming same are disclosed herein. In an embodiment, a stacked transistor structure has a wide central pedestal region and at least one relatively narrower channel region above and/or below the wider central pedestal region. The upper and lower channel regions are configured with a non-planar configuration, and include one or more semiconductor fins, nanowires, and/or nanoribbons. In some embodiments, the semiconductor material of the wider central portion is the same as the semiconductor material of the top channel region, or the bottom channel region, or both the top and bottom channel regions. In other embodiments, the semiconductor material of the wider central portion is compositionally different than the semiconductor material of the top and/or bottom channel regions. Numerous configurations and permutations will be apparent in light of this disclosure.

In any such cases, outermost sidewalls of the top and bottom channel regions, whether configured as fins, wires, and/or ribbons, may be vertically or linearly aligned with one another and/or with one or both sidewalls of the wider central pedestal region, as they can all be formed from the same initial fin structure, according to some embodiments of the present disclosure. Note that inner sidewalls of the top and bottom channel regions, whether configured as fins, wires, and/or ribbons, can also be vertically or linearly aligned with one another, in some embodiments. As previously explained, such collinearity of sidewalls does not require a perfectly vertical line or even a straight line, as will be appreciated.

The top and bottom channel regions may be configured the same or differently, with respect to shape and/or semiconductor materials. For instance, in one example embodiment, the top channel region is configured with two or more semiconductor fins and the bottom channel region is configured with one or more nanoribbons or nanowires. In some such example cases, the top fins comprise, for instance, silicon germanium (SiGe) or germanium suitable for p-type metal oxide semiconductor (PMOS) devices, and bottom wires or ribbons comprise a group III-V semiconductor material such as indium gallium arsenide (InGaAs), indium arsenide (InAs), or gallium antimonide (GaSb) suitable for n-type metal oxide semiconductor (NMOS) devices. In another example embodiment, the top channel region is configured with one or more semiconductor fins comprising a first semiconductor material (e.g., SiGe), and the bottom channel region is configured with one or more semiconductor fins comprising a second semiconductor material (e.g., InGaAs) that is compositionally different from the first semiconductor material. In some such cases, the number of fins making up the top channel region is different from the number of fins making up the bottom channel region. In other such embodiments, the number of fins on the top is the same as the number of fins on the bottom, but the fins on the bottom are wider than the fins on the top. Again, numerous variations and permutations will be apparent.

The fins or nanowires configured on the top and/or bottom channel regions, if present, are much narrower (e.g., by at least 5 nm or more narrow, or 1.5 times or more narrow) than the wider central region. On the other hand, the nanoribbons, if present, can be as wide as the central region in some embodiments, or narrower if so desired according to other embodiments. As will be appreciated, the difference between a nanowire and a nanoribbon is with respect to aspect ratio, to some extent. In particular, a nanoribbon is wider than it is tall, like a pancake for instance. In any such cases, the outer sidewalls of any outermost fins, nanowires, and/or nanoribbons in the top and bottom channel regions may be aligned with each other, and/or may be aligned with the sidewalls of the wider central portion, according to various embodiments. In some such embodiments, only channel region features of one of the top or bottom are aligned with the sidewalls of the wider central portion, while the channel region features of other of top or bottom are offset inward of the sidewalls of the wider central portion. In still other such embodiments, channel region features of the top are aligned with the sidewalls of the wider central portion, and the channel region features of the bottom are aligned with the sidewalls of the wider central portion, but the channel region features of the top are not aligned with the channel region features of the bottom.

In any such cases, the resulting structure having top and bottom non-planar channel regions can be processed to form top and bottom non-planar transistor structures, such as FinFETs (tri-gate, double-gate) and gate-all-around transistor devices. In complementary metal oxide semiconductor (CMOS) configurations, one of the top or bottom can be PMOS and the other of the top or bottom can be NMOS. In other embodiments, the top and bottom transistors may be the same type (both PMOS or NMOS), depending on the integrated circuit being fabricated.

Gate-first and gate-last processes, as well as etch-and-replace epitaxial source and drain processes, may be used, as will be appreciated. The top and bottom gate structures may be the same in some embodiments, and different in other embodiments such as in cases that utilize a CMOS configuration where, for example, the top gate structure has a p-type work function metal and the bottom gate structure has an n-type work function metal, or some other difference. In some example embodiments, for instance, the gate forming process includes a gate-last process wherein after the dummy gate materials are removed to expose the top and bottom channel regions of the stacked transistor structure, and then a first type of final gate structure is deposited over both the exposed top and bottom channel regions. The gate structure over the top channel region is then recessed down to the gate structure of the bottom channel region, thereby removing that gate structure from the top channel region as well as from the wider central portion. An insulator deposition and recess process can then be carried out to provide isolation around the wider central portion. The top final gate structure can then be applied.

Source and drain processing may be carried out prior to final gate structure formation, but not necessarily in all cases (such as in gate-first processes). In any such cases, and according to some embodiments, the source and drain regions associated with the top channel region can be processed first using etch and replace process to provide the desired epitaxial source and drain regions, followed by contact formation. Once the source and drain regions and respective contact structures associated with the top channel region are completed, a protective layer (e.g., oxide or nitride) may be provided thereon so that the wafer or other substrate on which the stacked configured is formed can be flipped so that the source and drain regions associated with the bottom channel region can be processed. Similar processing used on the top source and drain regions can be used to provide the desired epitaxial source and drain regions associated with the bottom, as well as the contact structures thereon. The top and bottom source and drain regions may be same or different, with respect to, for example, dopant type, dopant concentration, and/or semiconductor materials.

A number of advantages may result from such stacked transistor structures, relative to stacked transistor configuration that rely on a fin structure having a relatively uniform thickness from the top to bottom channel regions. For instance, a stacked transistor structure according to an embodiment, due to the relatively wider central region (which yields a low thermal resistivity), is able to conduct heat away from the top and bottom transistor devices much more robustly than a standard stacked configuration having a narrow fin. If there are metal connections to devices on both top and bottom of the device, this effect can be particularly strong, according to some embodiments.

In addition, the stacked transistor structure according to some embodiments is much more mechanically stable than a standard stacked fin structure having a uniform and relatively narrow width. To this end, fin collapse and bending are significant issues in developing a high-yielding FinFET process technology, and a structure according to various embodiments provided herein will alleviate or otherwise reduce such concerns. This is especially true relative to standard fin-on-insulator structures, such as for silicon-on-insulator (SOI) or semiconductor-on-insulator (XOI) structures where the resulting fins are on the underlying oxide or other insulator layer. This is because the insulator layer in such standard configurations is normally much softer (lower modulus) than the semiconductor crystal of the fin. This issue will become more critical as fins become narrower and narrower. In this regard, having only the device region of the fin be narrow while the isolation portion of the fin remains wide, according to an embodiment of the present disclosure, may significantly improves stability.

Another advantage of the stacked transistor structures according to some embodiments provided herein is that the relatively wider central region is also much more readily doped than would be a narrow fin. This is critical if there is not an insulator layer inserted into the fin structure and the electrical isolation need be obtained through a doping solution. Having a wide central fin region minimizes or otherwise helps to inhibit dopant segregation to semiconductor/insulator interface and will minimize the impact of unterminated states/surface charge at that interface, which may be resultant from etch or dielectric gap fill processes. In more detail, dopant segregation can be thought of as a diffusion limited process (as opposed to a reaction limited process). This generally means that dopant atoms leave a system at a rate determined by the rate at which they arrive at the semiconductor/insulator interface and the steady state chemical potential equilibration will occur at a much faster rate. Thus, having a wider semiconductor body to the fin structure will result in less depletion from the center of the fin structure than will occur for a relatively narrow standard fin body (due to greater diffusion distance). This dose loss is from the semiconductor body of the fin to the insulator region (e.g., an oxide such as silicon dioxide) adjacent to the semiconductor fin, can be referred to as dose loss to trench, although the dose which is lost may physically remain on states on or in close-proximity to the semiconductor/insulator interface (e.g., within Angstroms of) in electrically inactive states (hence they no longer contribute to isolation).

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer.

Note that the use of "source/drain" herein is simply intended to refer to a source region or a drain region or both a source region and a drain region. To this end, the forward slash ("/") as used herein means "and/or" unless otherwise specified, and is not intended to implicate any particular structural limitation or arrangement with respect to source and drain regions, or any other materials or features that are listed herein in conjunction with a forward slash.

Architecture

FIG. 1a illustrates a cross-section view of an integrated circuit including a stacked transistor structure having a wide central pedestal region and at least one narrow channel region above and/or below the pedestal region, in accordance with an embodiment of the present disclosure. The cross-section is taken parallel to and through the gate line of the structure. As can be seen, this example configuration includes two fins in each channel region of the upper devices, and two nanoribbons in each channel region of the lower devices. Other embodiments may have fewer or more fins, or nanowires rather than nanoribbons, or some other combination of fins, nanowires and/or nanoribbons. As can be further seen in this example case, the fins comprise the same material as semiconductor layer 109, and the nanoribbons comprise the same material as semiconductor layer 105, although this is not necessary and other embodiments may be configured differently. Isolation 107 provides electrical isolation between the upper and lower devices. Insulator 120 is adjacent the wide central region. The upper gate structure includes gate dielectric 117a and gate electrode 119a, while the lower gate structure includes gate dielectric 117b and gate electrode 119b. Other configurations can be used as well, as will be appreciated in light of this disclosure.

Note how the central region (also referred to as a pedestal herein) is wider than each fin in the upper device region (more than two times wider, in this example case), and that the nanoribbons in the lower device region have the same width as the central portion. Further note that, in this example embodiment, the outer sidewalls of the fins and nanoribbons are aligned or otherwise collinear with each other as well as the sidewalls of the wider central portion. In other embodiments, there might be only one fin, and that one fin has its sidewalls offset and inward from the sidewalls of the wider central portion (and therefore not be collinear with the wider central portion). Likewise, the outer sidewalls of the nanowires or nanoribbons may be offset and inward from the sidewalls of the wider central portion. In any such cases, there will be a channel region in either or both the upper and lower device regions that is considerably narrower (e.g., 1.5 to 5 times or more narrow) than the wider central region.

Semiconductor layer 109 may comprise, for example, a first semiconductor material (e.g., silicon, germanium, SiGe, a semiconducting oxide such as indium gallium zinc oxide (IGZO), or other suitable group IV semiconductor material), while layer 105 may comprise a second semiconductor material (e.g., InGaAs, InAs, GaSb, a semiconducting oxide, or other suitable group III-V semiconductor material). Alternatively, layers 105 and 109 may comprise the same semiconductor materials. In the example shown, the fins include the same material as layer 109, but in other embodiments the fins may be compositionally different from layer 109. Likewise, the nanoribbons include the same material as layer 105 in the example shown, but in other embodiments the nanoribbons may be compositionally different from layer 109. As previously explained, isolation 107 electrically isolates the upper and lower devices, and can be implemented with an insulator layer (e.g., oxide or nitride) between layers 105 and 109, or by way of doping or fixed charge isolation. Insulator 120 adjacent the wider central region including both 105 and 109, and can be any suitable insulator fill, such as silicon dioxide. Numerous such configurations and variations will be apparent in light of this disclosure.

The upper and lower gate structures can be implemented with any suitable processes and materials. Further note that, in addition to gate dielectrics and gate electrodes, the gate structures may further include gate spacers (hidden in the cross-section shown). Any number of gate structure configurations can be used. If present, the gate spacers may be, for example, silicon nitride or silicon dioxide or a carbon-doped oxide or an oxynitride or a carbon-doped oxynitride. The gate dielectrics 117a-b may be, for example, any suitable gate dielectric material(s) such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used. Further, the gate electrodes 119a-b may comprise a wide range of suitable metals or metal alloys, such as aluminum, tungsten, titanium, tantalum, copper, titanium nitride, or tantalum nitride, for example.

In some embodiments, the gate dielectrics 117a-b and/or gate electrodes 119a-b may include a multilayer structure of two or more material layers or components. For instance, in one such embodiment, the gate dielectric structures 117a or 117b (or both) is a bi-layer structure having a first dielectric material (e.g., silicon dioxide) in contact with the channel region and a second dielectric material (e.g., hafnium oxide) in contact with the first dielectric material, the first dielectric material having a dielectric constant that is lower than the dielectric constant of the second dielectric material. Likewise, the gate electrode structures 119a or 119b (or both) may include a central metal plug portion (e.g., tungsten) with one or more outer work function layers and/or barrier layers (e.g., tantalum, tantalum nitride, an aluminum-containing alloy), and/or a resistance reducing cap layer (e.g., copper, gold, cobalt, tungsten). In some embodiments, the gate dielectrics 117a-b and/or gate electrodes 119a-b may include grading (increasing or decreasing, as the case may be) of the concentration of one or more materials therein. Further note that the gate structure of the upper devices may be the same as the gate structure of the lower device, or different. In some example embodiments, for instance, the gate electrode 119a of the upper gate structure includes a p-type work function metal suitable for PMOS devices, while the gate electrode 119b of the lower gate structure includes an n-type work function metal suitable for NMOS devices.

Other variations on gate structure will be apparent. For instance, in the example embodiment, the gate dielectric 117a is on semiconductor layer 109 between fins of a given fin-pair. In addition, the gate dielectric 117a is on the field region of insulator layer 120. In other embodiments, gate dielectric 117a may be selectively deposited only on semiconductor material 109 or otherwise removed from insulator 120. Numerous gate structure configurations can be used as will be appreciated in light of this disclosure, and the present disclosure is not intended to be limited to any particular such configurations.

Figure 1B:
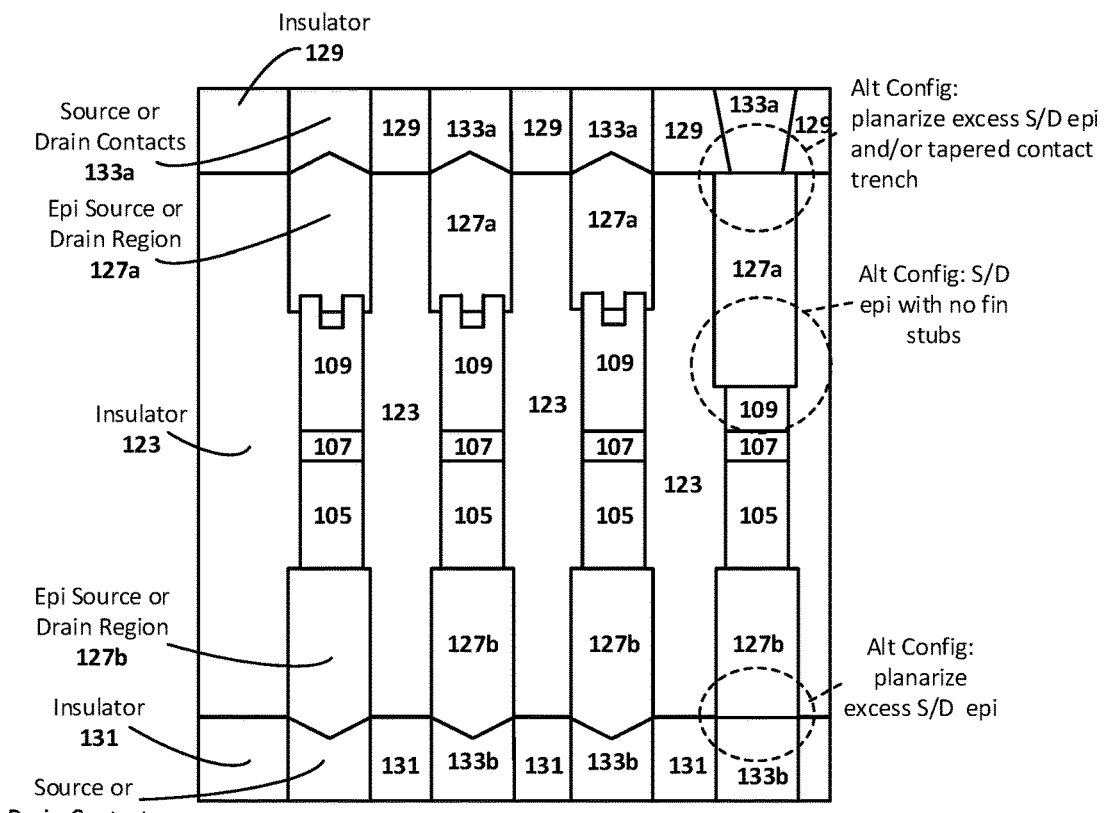
FIG. 1b illustrates another cross-section view of the integrated circuit of FIG. 1a, in accordance with an embodiment of the present disclosure. The cross-section is taken parallel to the gate line and through the source or drain region of the structure.

FIG. 1b illustrates another cross-section view of the integrated circuit of FIG. 1a, in accordance with an embodiment of the present disclosure. This particular cross-section is again taken parallel to the gate line but through the source or drain region of the structure. As can be seen in this example embodiment, the wider central region (including portions of semiconductor layers 105 and 109) is also present in the source/drain region, along with the isolation 107. However, further note that a substantial portion of the fins in the upper device region have been removed and replaced with epitaxial source or drain regions 127a. In a similar fashion, note that the nanoribbons in the lower device region have been removed and replaced with epi source or drain regions 127b. Further note that the amount of material removed from layers 105 and 109 to provide the recess in which the epi source/drain regions will be formed can vary from one embodiment to the next. For instance, in other embodiments, the fins in the upper device region can be completely removed and replaced with an epitaxial deposition 127a, so there are no remaining fin stubs (as shown in the alternative configuration on the far right mid-portion of FIG. 1b). In any such cases, the epi source or drain regions 127a can be deposited on a remnant of the layer 109 semiconductor material. Isolation 107 isolates the upper source/drain region 127a from the lower source/drain region 127b. Insulator 123 provides further isolation between laterally neighboring source/drain regions and structural integrity. Source and drain contacts 133a are formed in insulator layer 129 in the upper device region, and source and drain contacts 133b are formed in insulator layer 131 in the lower device region.

In some embodiments, the epi source/drain regions 127a-b are faceted and overgrown from the trench within insulator layer 123, and the corresponding source or drain contact 133a-b lands on that faceted excess portion. Alternatively, in other embodiments, the faceted excess portion of epi source/drain regions 127a-b can be removed (e.g., via chemical mechanical planarization, or CMP), and the corresponding source or drain contact 133a-b lands on that planarized portion (as shown in the alternative configuration on the far right upper corner of FIG. 1b where the interface between contact 133a and source/drain region 127a is flat). Further note that the contact trenches formed within insulator layers 129 and 131 may have substantially vertical sidewalls in some embodiments, but may have tapered or curvilinear sidewalls in other embodiments (as shown in the alternative configuration on the far right upper corner of FIG. 1b where the contact 133a trench is tapered, such that the bottom of contact 133a is relatively smaller than the source/drain region upon which it is landed). As will be further appreciated, in some embodiments, the removal of the source/drain regions 127a-b and replacement with epi source/drain material may result in an upper portion of the source/drain region (the overgrowth portion of the epi deposition) which is wider (e.g., by 1-10 nm) than the original fin structure width. Any combination of such features may result.

The epi source/drain regions 127a can be the same semiconductor material as the epi source/drain regions 127b, but need not be. For instance, PMOS source/drain regions may include, for example, group IV semiconductor materials such as silicon, germanium, SiGe, SiGe alloyed with carbon (SiGe:C). Example p-type dopants include boron, gallium, indium, and aluminum. NMOS source/drain regions may include, for example, group III-V semiconductor materials such as two or more of indium, aluminum, arsenic, phosphor, gallium, and antimony, with some example compounds including but not limited to indium aluminum arsenide (InAlAs), indium arsenide phosphide (InAsP), indium gallium arsenide phosphide (InGaAsP), gallium antimonide (GaSb), gallium aluminum antimonide (GaAlSb), indium gallium antimonide (InGaSb), or indium gallium phosphide antimonide (InGaPSb). In some specific such example embodiments, for instance, semiconductor material 109 is germanium, and source/drain regions 127a comprise SiGe (e.g., $Si_{1-x}Ge_x$ where $0.20 \leq x \leq 0.99$; or $Si_xGe_y:C_z$ where $8 \leq x \leq 16$; $80 \leq y \leq 90$; $1 \leq z \leq 4$; $x+y+z=100$). In such an embodiment, semiconductor material 105 could be, for instance, $InxGa_{1-x}As$ $0.51 \leq x \leq 0.55$; $0.10 \leq y \leq 1.00$ or InAs, and source/drain regions 127b comprise an indium-containing compound (e.g., $In_yAl_{1-y}As$ where $0.60 \leq y \leq 1.00$; or $InAs_yP_{1-y}$ where $0.10 \leq y \leq 1.00$; $In_yGa_{1-y}As_zP_{1-z}$ where $0.25 \leq y \leq 1.00$ and $0.50 \leq z \leq 1.00$; $In_xGa_{1-x}Sb$ where $0.25 \leq x \leq 1.00$, or $In_xGa_{1-x}P_ySb_{1-y}$ where $0.25 \leq x \leq 1.00$; $0.00 \leq y \leq 0.10$). Example N-type dopants include phosphorus, arsenic, and antimony.

In some cases, the epi source/drain regions 127a-b may include a multilayer structure, such as a germanium cap on a SiGe body, or a germanium body and a carbon-containing SiGe spacer or liner between the corresponding channel region and that germanium body. In any such cases, a portion of the epi source/drain regions 127a-b may have a component that is graded in concentration, such as a graded germanium concentration to facilitate lattice matching, or a graded dopant concentration to facilitate low contact resistance. Numerous epi source/drain configurations can be used as will be appreciated in light of this disclosure, and the present disclosure is not intended to be limited to any particular such configurations.

The source/drain contact structures 133a can be the same material as the source/drain contact structures 133b, but need not be such as in cases where it is desired to optimize p-type and n-type contact structures, similar to p-type and n-type gate electrode structures. In addition, the source/drain contact structures 133a-b may include multiple layers or features, such as liners or barrier layers (e.g., tantalum, tantalum nitride) and resistance reducing materials (e.g., nickel, platinum, nickel platinum, cobalt, titanium, germanium, nickel, gold, or alloys thereof such as germanium-gold alloy, or a multilayer structure of titanium and titanium nitride all have good contact resistance), in addition to plug/core materials (e.g., tungsten, aluminum, ruthenium, cobalt, copper, or alloys thereof). Numerous source/drain contact structures can be used in accordance with an embodiment of the present disclosure, as will be appreciated, and the present disclosure is not intended to be limited to any particular such configurations.

The insulator materials 120, 123, 129, and 131 (as well as 111, from FIG. 1c to be discussed in turn) may all be the same insulator material according to some embodiments, while in other embodiments one or more may be compositionally different from the others so as to provide a desired etch selectivity, different dielectric constant, and/or greater structural support. To this end, any number of suitable insulator materials can be used for 111, 120, 123, 129, and 131, such as silicon dioxide, silicon nitride, silicon carbide, or a polymer, or a porous version of any of these.

Figure 1C:
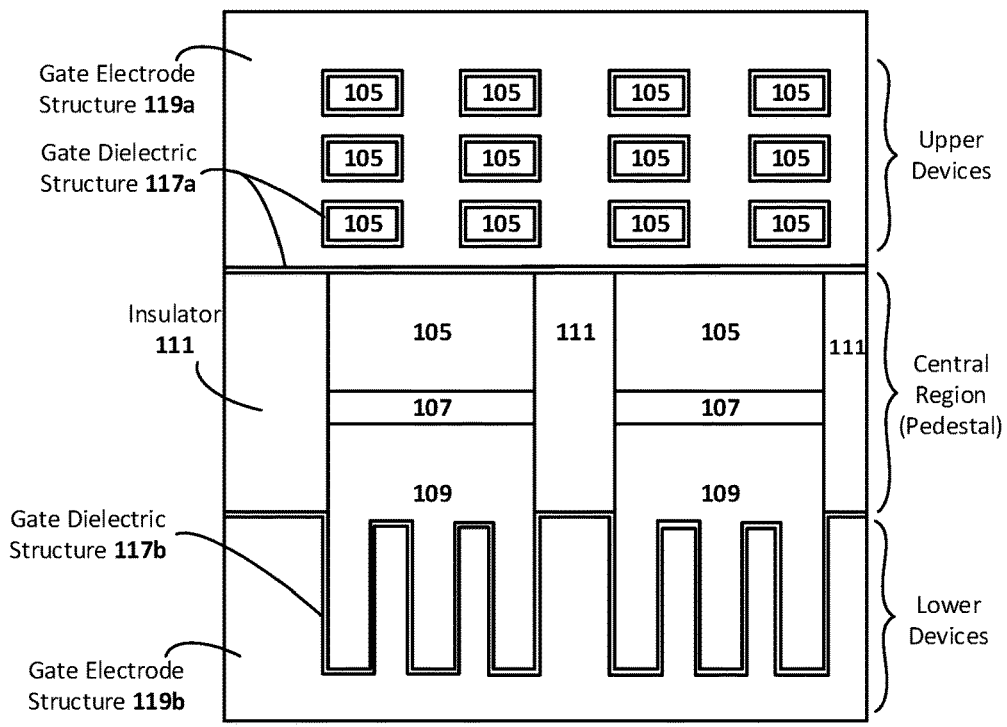
FIG. 1c illustrates a cross-section view of an integrated circuit including a stacked transistor structure having a wide central pedestal region and at least one narrow channel region above and/or below the pedestal region, in accordance with another embodiment of the present disclosure. The cross-section is taken parallel to and through the gate line of the structure.
Figure 1D:
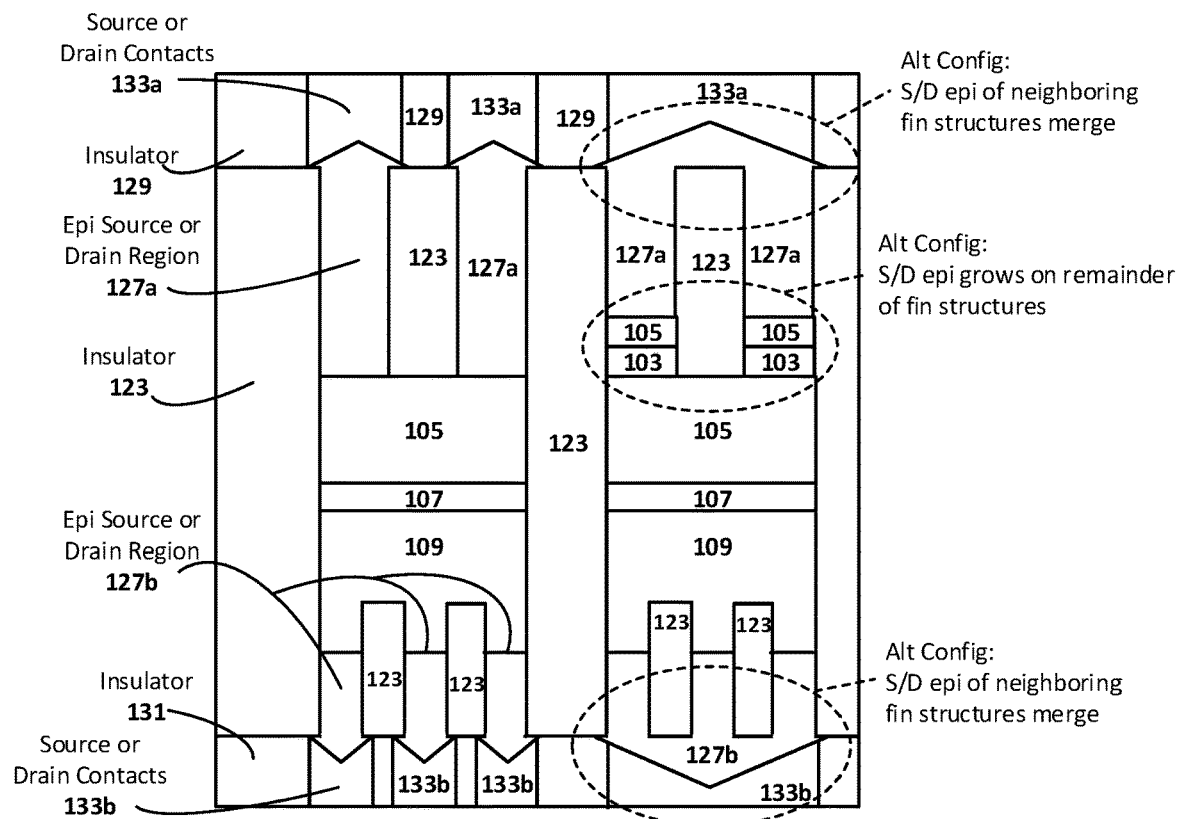
FIG. 1d illustrates another cross-section view of the integrated circuit of FIG. 2a, in accordance with an embodiment of the present disclosure. The cross-section is taken parallel to the gate line and through the source or drain region of the structure.

FIGS. 1c and 1d illustrate cross-section views similar to those shown in FIGS. 1a and 1b, respectively, except that the channel regions of the upper and lower devices are configured differently, in accordance with another embodiment. To the extent that there are similarities between FIGS. 1a-1c and FIGS. 1b-1d, the previous relevant discussion provided with respect to FIGS. 1a and 1b is equally applicable here to FIGS. 1c and 1d, as will be appreciated.

As can be seen in FIG. 1c, this example configuration includes nanowires in the channel regions of the upper devices, and fins in the channel regions of the lower devices. Other embodiments may have fewer or more fins and/or nanowires, or some other combination of fins, nanowires and/or nanoribbons. As can be further seen, the fins comprise the same material as semiconductor layer 109, and the nanowires comprise the same material as semiconductor layer 105, although this is not necessary and other embodiments may be configured differently as previously noted. Isolation 107 provides electrical isolation between the upper and lower devices. Insulator 111 is adjacent the wide central region, and may be the same as insulator 120 or some other suitable insulator fill material (e.g., silicon dioxide, silicon nitride). The upper gate structure includes gate dielectric 117a and gate electrode 119a, while the lower gate structure includes gate dielectric 117b and gate electrode 119b. Other configurations can be used as well, as will be appreciated in light of this disclosure.

Just as with the example embodiment shown in FIG. 1a, note how the central region (pedestal) is wider than each fin in the lower device region (more than three times wider, in this example case), as well as each of the nanowires in the upper device region (more than two times wider, in this example case). Further note that the sidewalls of the outermost fins and nanoribbons of the upper and lower device regions are aligned (collinear) with each other as well as with the sidewalls of the wider central portion, according to some such embodiments. In other embodiments, there might be only one fin or two fins in the upper or lower device region, each fin having its outer sidewall offset and inward from the sidewalls of the wider central portion. Likewise, the outer sidewalls of the nanowires or nanoribbons may be offset and inward from the sidewalls of the wider central portion. In any such cases, there will be a channel region in either or both the upper and lower device regions that is narrower than the wider central region.

As can be seen in FIG. 1d, the wider central region (including portions of semiconductor layers 105 and 109) is also present in the source/drain region, along with the isolation 107. As previously explained, the amount of material removed from layers 105 and 109 to provide the recess in which the epi source/drain regions will be formed can vary from one embodiment to the next. For instance, in some embodiments, all of the fin structures (from which the nanowires in the channel region are formed) in the upper device region are removed and replaced with epitaxial source or drain regions 127a. In other embodiments, only part of the fin structure in the upper device region is removed and replaced with an epitaxial deposition 127a, so there is some remnant of the fin structure under the epi source or drain regions 127a (as shown in the alternative configuration on the far right—see remnants of 103 and 105 between the wide central region and the source/drain regions 127a). In any such cases, the epi source or drain regions 127a can be deposited on a remnant of the layer 105 semiconductor material. In a similar fashion, note that all or a substantial portion of the fins in the lower device region can be removed and replaced with epi source or drain regions 127b, as previously discussed with respect to the fins in the upper region of the example embodiment shown in FIG. 1b.

In some embodiments, the epi source/drain regions 127a-b are faceted and overgrown from the trench within insulator layer 123, and the corresponding source or drain contact 133a-b lands on that faceted excess portion. In some such cases, the epi source/drain material that overflows from the recesses merges together to form a single source/drain region, such as shown in the alternatively configuration in the upper right corner of FIG. 1d. In other embodiments, the overgrowths stay separate and isolated from one another (as shown on the left side of FIG. 1d). Alternatively, in other embodiments and as previously explained, the faceted excess portion of epi source/drain regions 127a-b can be removed (e.g., via chemical mechanical planarization, or CMP), and the corresponding source or drain contact 133a-b lands on that planarized portion. The shape of the contact trenches formed within insulator layers 129 and 131 may vary as well, as previously explained. Any combination of such features may result.

The integrated circuit including the stacked transistor architecture may include other features as well, as will be appreciated. For example, the structure may further include interconnect features and layers. For instance, a first vertical interconnect feature can be provisioned that connects a given upper source or drain region to the corresponding lower source or drain region, and a second vertical interconnect feature can be provisioned that connects a given upper gate structure to the corresponding lower gate structure. Such interconnect features can be provisioned, for example, via standard lithographic and masking operations. Further note that while the fins and nanoribbons are shown with an idealized state (e.g., perfectly vertical sidewalls and perfectly horizontal tops and bottoms), all such geometry could be rounded or tapered or otherwise non-ideal. For instance, the fins could be trapezoidal in shape, or hourglass shaped, or some other shape, as a result of the forming processes.

FIGS. 2a through 2i illustrate example cross-section views of example channel region configurations of stacked fin architecture, according to various embodiments of the present disclosure. Again, the cross-sections are taken parallel to and through the gate line of the structure, although the gate line is not shown, so as to allow focus on the channel region configurations.

FIG. 2a illustrates the general concept, showing a stacked fin configuration that includes an active region A for upper devices and an active region B for lower devices. As will be appreciated, each of active regions A and B may include one or more fins, nanowires, or nanoribbons. In between active regions A and B is a central body that is relatively wider than the channel features of at least one of the active regions A and B. The central body of this example includes a central body region A and a central body region B. As will be appreciated, the use of terms like "above" "below" "upper" "lower" "top" and "bottom" are simply used to facilitate discussion and are not intended to implicate a rigid structure or fixed orientation; rather such terms merely indicate spatial relationships when the structure is in a given orientation.

FIG. 2b illustrates a stacked fin configuration that includes an upper active region that includes two semiconductor fins and a lower active region that also includes two semiconductor fins, according to an embodiment. The fins have a width that is at least two times smaller than the width of the central body regions A and B. In FIG. 2c the upper active region includes three semiconductor fins and the lower active region includes two semiconductor fins, according to an embodiment. The top fins have a width that is at least three times smaller than the width of the central body regions A and B, and the bottom fins have a width that is at least two times smaller than the width of the central body regions A and B. Each of the upper active region, central body region A, central body region B, and lower active region can be implemented with the same semiconductor material, or each with a different semiconductor material. In some cases, one semiconductor material is used for the upper active region and central body region A, and another different semiconductor material is used for the lower active region and central body region B. In short, any combination of semiconductor materials can be used.

FIG. 2d illustrates a stacked fin configuration that includes an upper active region that includes two semiconductor fin structures suitable for forming nanowires and a lower active region that also includes two semiconductor fins, according to an embodiment. Each of the fins and fin structures has a width that is at least two times smaller than the width of the central body regions A and B. In FIG. 2e the upper active region includes three semiconductor fin structures suitable for forming nanowires and the lower active region includes two semiconductor fin structures suitable for forming nanowires, according to an embodiment. The top fin structures have a width that is at least three times smaller than the width of the central body regions A and B, and the bottom fin structures have a width that is at least two times smaller than the width of the central body regions A and B. As can be seen, the fin structures include alternating layers of sacrificial material (cross-hatched) and semiconductor material. The semiconductor material may be the same as the corresponding central body region, or not. Note that the sacrificial materials used in the top fin structures may be the same as the sacrificial material used in the bottom fin structures, or not. In short, any combination of semiconductor and sacrificial materials can be used. The sacrificial material can be any insulator or semiconductor material that can be selectively etched (removed) via a given etch chemistry with respect to the semiconductor material used for the nanowires. Further note that the fin structures are shown before the nanowires are released (by removal of the sacrificial material).

The example stacked fin configuration FIGS. 2f through 2i each has an upper active region that includes a semiconductor fin structure suitable for forming nanoribbons and a lower active region that includes either semiconductor fins (FIGS. 2f showing two fins, 2g showing three fins, and 2h showing one fin) or fin structures suitable for forming nanowires (FIG. 2i showing one fin structure), according to various embodiments. Each of the bottom fins or fin structures has a width that is at least two times smaller than the width of the central body regions A and B, while the top fin structure has the same width (not counting any tapering that results from the forming process). Again, the fin structures include alternating layers of sacrificial material (cross-hatched) and semiconductor material. The semiconductor material may be the same as the corresponding central body region, or not. Note that the sacrificial materials used in the top fin structure may be the same as the sacrificial material used in the bottom fin structures, or not. In short, any combination of semiconductor and sacrificial materials can be used. Further note that the fin structures of FIGS. 2f through 2i are shown before the nanoribbons are released (by removal of the sacrificial material). FIG. 2i' shows the fin structure of FIG. 2i after the nanoribbons are released by removal of the sacrificial material, according to one example embodiment. Note, this release need not occur over the entire length of the fin structure, but rather may occur only in the channel region of the device which is surrounded by the gate structure (as shown in other figures). The release process can be carried out, for instance, during the gate forming process, such as gate-last process after any dummy gate materials are removed but before the final gate materials are deposited.

Methodology

Figure 3A:
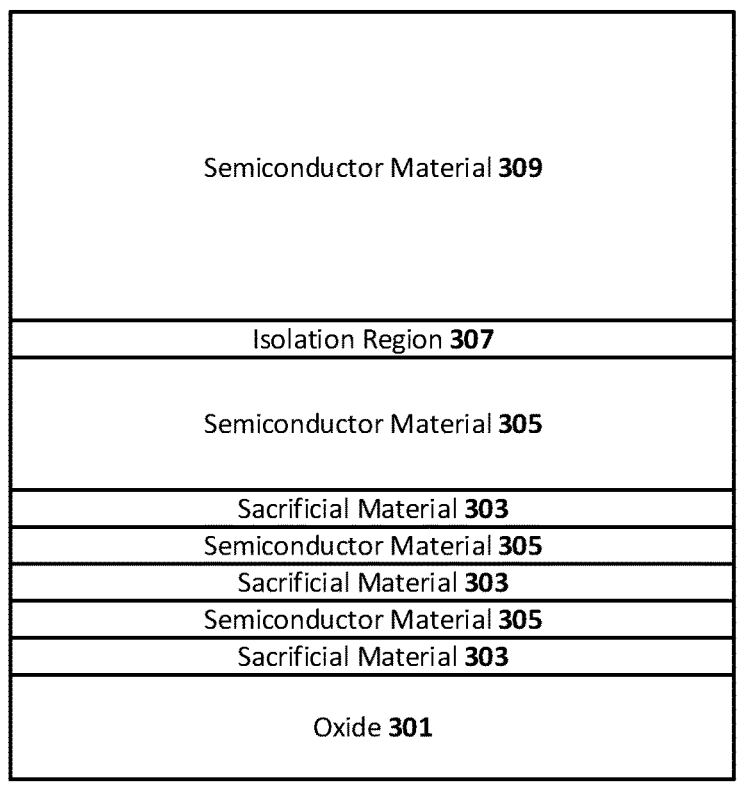
FIGS. 3a though 3p are cross-sections views illustrating a process for forming an integrated circuit including a stacked transistor structure having a wide central pedestal region and at least one narrow active channel region above and/or below, the pedestal region, in accordance with various embodiments of the present disclosure. The cross-section in FIGS. 3a-3l' is taken parallel to and through the gate line of the structure, and the cross-section in FIGS. 3m-3p is taken parallel to the gate line and through the source or drain region of the structure.

FIGS. 3a though 3p are cross-sections views illustrating a process for forming an integrated circuit including a stacked transistor structure having a wide central pedestal region with nanowire or nanoribbon in the bottom device region and multiple fins in the upper device region, in accordance with various embodiments of the present disclosure. As can be seen in the example embodiment of FIG. 3a, the process begins with providing alternating layers of sacrificial material 303 and semiconductor material 305 over an oxide layer 301. A semiconductor layer 309 is then provided on top of the alternating layer stack. Standard deposition techniques can be used to provide the various layers, such as chemical vapor deposition (CVD), physical layer deposition (PLD), a layer transfer process, and atomic layer deposition (ALD). Isolation region 307 may be, for example, a distinct layer that is deposited between the relatively thicker uppermost layer 305 and layer 309 according to some embodiments, or in other embodiments is a doped portion of the relatively thicker uppermost layer 305 and/or layer 309. In the latter case, the doped portion is provided at the interface between layers 305 and 309 according to some embodiments, but in other embodiments may further extend into one or both of the respective layers 305 and 309.

The resulting stack as well as the individual layers can have any number of thicknesses, and are not necessarily drawn to scale. For instance, in some such example embodiments, the oxide layer is in the range of 30 to 500 nanometers (nm) thick, the relatively thin and alternating layers of sacrificial material 303 and semiconductor material 305 are each in the range of 5 to 40 nm thick, the relatively thick layer of semiconductor material 305 is in the range of 25 to 200 nm thick, the isolation region 307 is in the range of 5 to 50 nm thick, and the semiconductor material layer 309 is in the range of 40 to 400 nm thick. In a more general sense, each of the layers may be any suitable thickness as will be appreciated in light of this disclosure.

The oxide layer 301 can be, for instance, a layer of silicon dioxide on a bulk silicon or gallium arsenide substrate, or the oxide layer of a semiconductor-on-insulator (SOI) substrate configuration, although any number of other configurations can be used as well, and as will be appreciated. In still other embodiments, the oxide layer 301 can be a converted layer (a silicon layer that has been converted to silicon dioxide during an oxygen-based annealing process). In other embodiments, the oxide layer 301 is optional and not used or otherwise present. In such cases, oxide layer 301 could be replaced, for example, with a bulk substrate.

The sacrificial material 303 can be any insulator or semiconductor material that can be selectively removed via a given etch chemistry with respect to the semiconductor material 305 used for the nanowires (i.e., the etch chemistry removes the sacrificial material 303 at a much higher rate than it removes the semiconductor material 305). Semiconductor materials 305 and 309 may be the same or different. Note that, the role of materials 303 and 305 can be reversed, depending on the type of transistor device being formed. For example: for PMOS transistors of a given integrated circuit, material 303 can be the sacrificial material and material 305 can be the semiconductor material used to make p-type nanowires or nanoribbons; and for NMOS transistors of that same given integrated circuit, material 303 can be the semiconductor material used to make n-type nanowires or nanoribbons and material 305 can be the sacrificial material. In such cases, the etch chemistry is chosen for its selectivity to the nanowire/nanoribbon material (the desired channel material), relative to the material that is to be removed or otherwise etched at a much higher rate (the sacrificial material).

The isolation region 307 can be, for example, a discrete layer of insulation material between upper layer 309 and lower layer 305. Alternatively, isolation region 307 can be a doped region of either (or both) of the adjacent upper layer 309 or lower layer 305. In any case, the doped region effectively impairs flow of carriers across that region 307, thereby inhibiting sub-channel leakage. In a more general sense, any isolation techniques and/or layers can be used to implement isolation region 307, as will be appreciated in light of this disclosure.

In one example embodiment, sacrificial material 303 is silicon dioxide, semiconductor 305 is silicon, isolation region 307 is silicon nitride, and semiconductor material 309 is germanium. In such a case, the resulting structure can have silicon nanowires or nanoribbons (formed from semiconductor layers 305) for NMOS devices in the lower region, and germanium fins (formed from semiconductor layer 309) for PMOS devices in the upper region. In another example embodiment, sacrificial material 303 is gallium arsenide (GaAs), semiconductor material 305 is InGaAs, isolation region 307 is silicon nitride, and semiconductor material 309 is germanium or SiGe. In such a case, the resulting structure can have InGaAs nanowires or nanoribbons (formed from semiconductor layers 305) for NMOS devices in the lower region, and germanium or SiGe fins (formed from semiconductor layer 309) for PMOS devices in the upper region. In a more general sense, layers 303, 305, and 307 can be any combination of materials that facilitate an etch electivity with respect to a given etch chemistry, to allow for release of the nanowires or nanoribbons in the upper and/or lower channel regions as well as electrical isolation between the upper and lower channel regions. Numerous such material systems will be apparent, including but not limited to group IV semiconductor materials and III-V semiconductor materials, to provide various PMOS and NMOS devices.

Figure 3B:
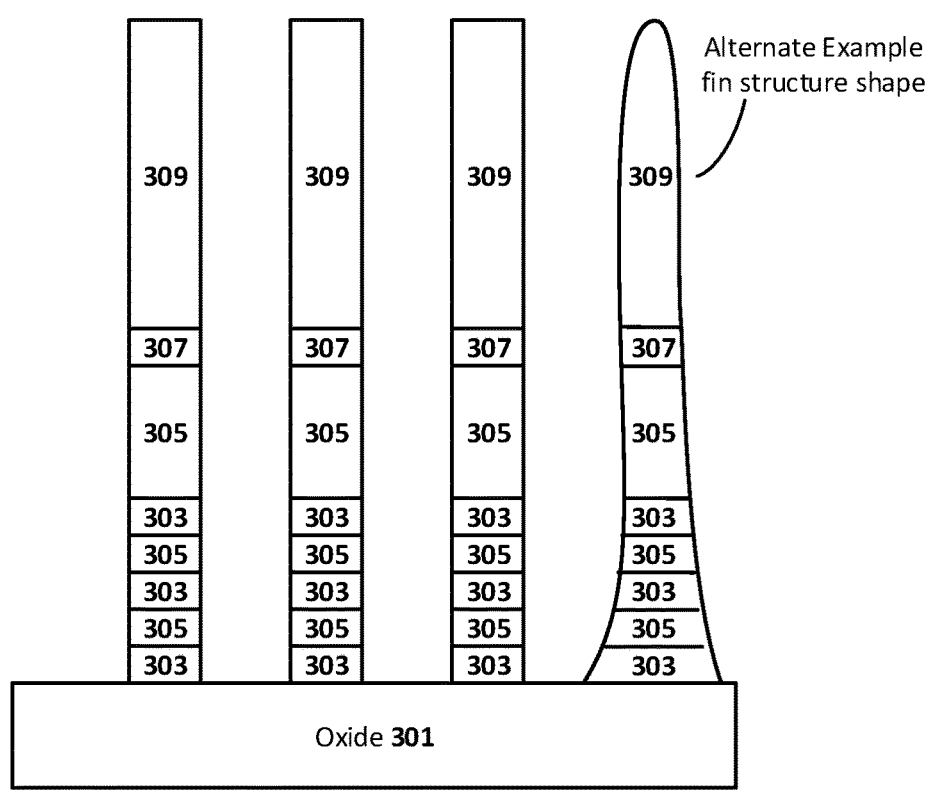

FIG. 3b shows the resulting structure after fin structures have been patterned and etched, according to an embodiment. As can be seen, four fin structures are shown, but any number of such fin structures can be made. Standard masking and etch techniques can be used, including wet and/or dry as well as isotropic and/or anisotropic etch schemes, as will be appreciated. Note the etch chemistry may change during the etch process to accommodate the change in materials making up the stack. As can be further seen, the recess etch stops on the oxide layer 301, but in other embodiments may continue into oxide layer 301 to some degree (e.g., 1 to 20 nm). Note that the three resulting example fin structures on the left side are shown with substantially vertical sidewalls. In other embodiments, note that the resulting fin structures may be tapered such that the thickness of layer 309 is less than the thickness of layers 303 and 305, such as shown in the resulting example fin structure on the right side. Such tapering may be, for instance, a product of the etch scheme used and/or the height of the fin structure. Further note, however, that even though the sidewalls are not perfectly vertical, the sidewalls of each material section are collinear with one another. The rounding at the top and the flare out at the bottom may also result from standard etch schemes, and that is okay, as will be appreciated.

Figure 3C:
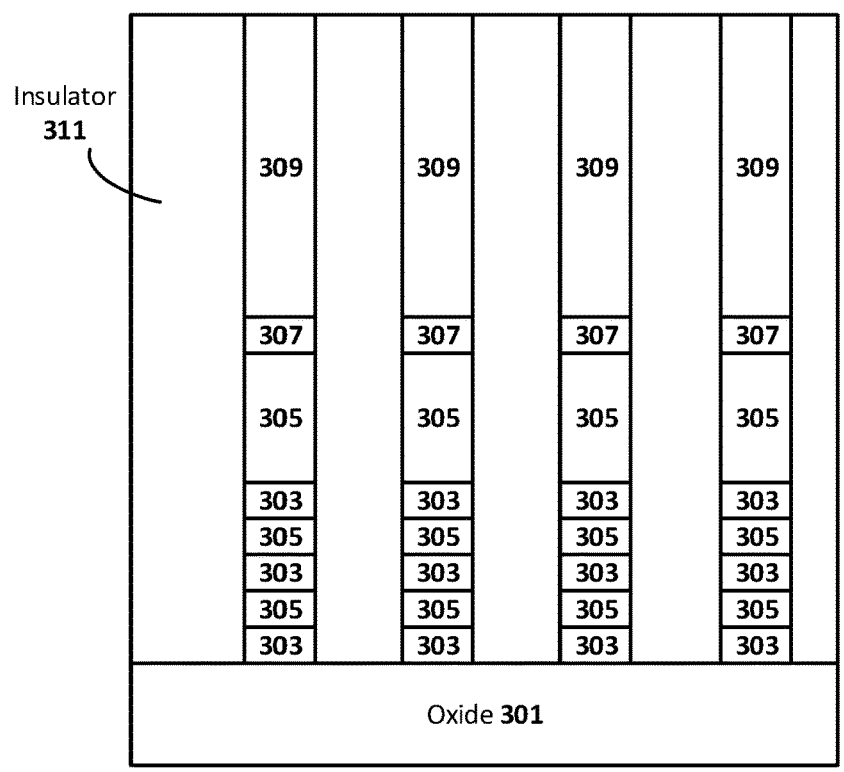

FIG. 3c shows the resulting structure after an insulator 311 is deposited into the trenches between the fin structures and planarized. Insulator 311 can be any suitable insulator materials, such as silicon dioxide, silicon nitride, silicon carbide, or a polymer. In some example cases, the insulator 311 is deposited as a flowable dielectric (e.g., flowable oxide, nitride, or carbide) and then cured. Such a flowable dielectric is particularly beneficial when the trenches being filled have a relatively high aspect ratio (e.g., 10:1 or more), as the flowable dielectric helps avoid pinch-off at that top of the trench (and the related void formation within the trench). The use of flowable dielectrics is also beneficial due to their low-temperature processing conditions, according to some such embodiments.

Figure 3D:
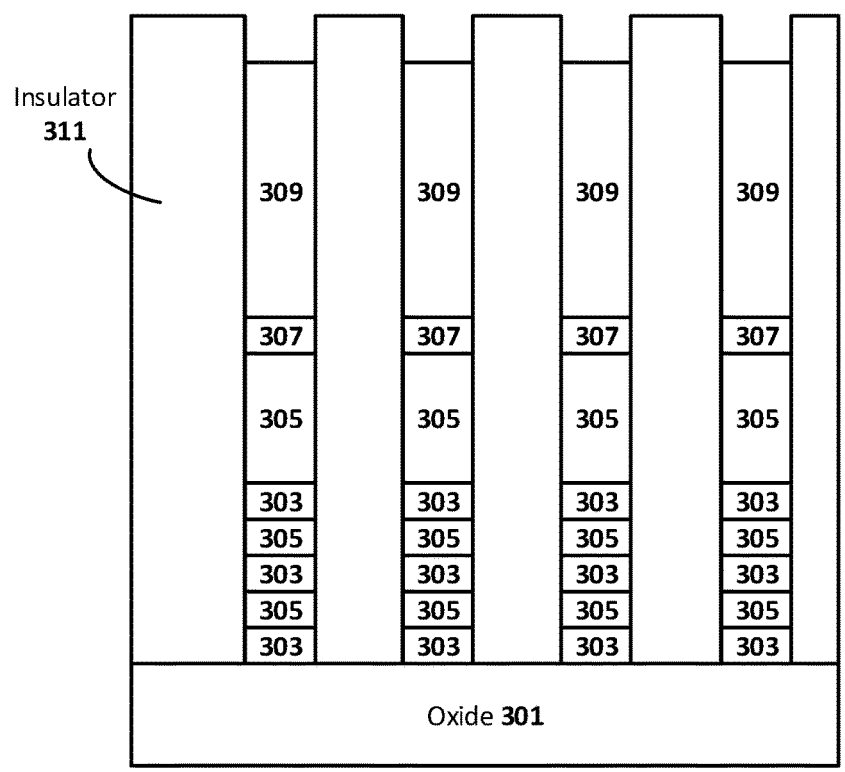

FIG. 3d shows the resulting structure after the fin structures have been recessed to allow for spacer formation. Standard etch schemes can be used. Further note that the etch may be a selective etch (selective to insulator 311, such that material 309 etches much faster than insulator 311). Alternatively, a mask can be patterned on the top of the structure to protect the insulator 311 from the etchant. Any number of schemes can be used. The depth of the recess can vary from one embodiment to the next, but in some such embodiments, is in the range of 5 to 25 nm. In a more general sense, the depth to which the fin structures are recessed can be any depth that will allow for formation of a spacer that can then be used for forming the top portions of the fin structures into narrower fins or nanowires, as will be discussed in turn.

Figure 3E:
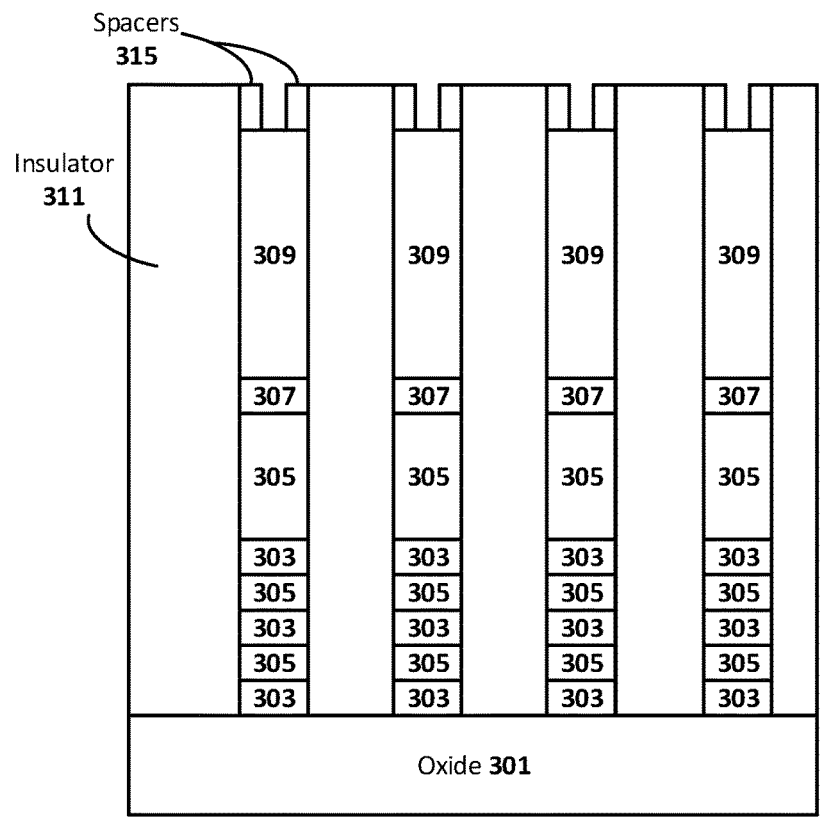

FIG. 3e shows the resulting structure after the spacer 315 has been formed within the recess on top of the fin structures. The spacer 315 can be deposited and patterned using standard techniques, as will be appreciated. In this particular example case, the spacer 315 material can be any material that will withstand the etch chemistry used to etch semiconductor material 309 into fins. For instance, the spacer can be silicon nitride (SiN) and the semiconductor material can be SiGe or germanium. In such a case, the etch chemistry would be selective to SiN but not to a germanium-containing semiconductor (i.e., the etch chemistry removes the germanium-containing semiconductor at a much higher rate that the SiN). Numerous such selective etch schemes can be used, as will be appreciated in light of this disclosure.

Figure 3F:
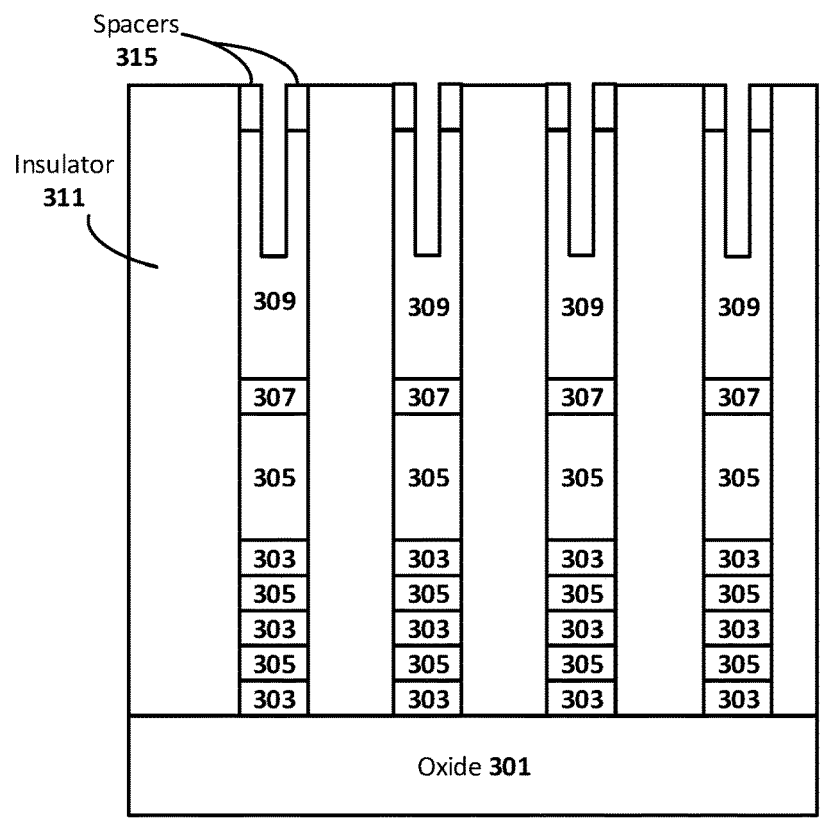

FIG. 3f shows the resulting structure after the top portion of the semiconductor material 309 is etched into fins, using the patterned spacer 315. Standard etching can be used (e.g., dry anisotropic etch to provide relatively rectangular fins, although some taper may occur which is fine). The depth of the etch can vary from one embodiment to the next, but largely depends on the desired height of the fins in the upper device region. In some embodiments, the depth of the etch is in the range of 20 nm to 70 nm (so as to provide fins that are about 20 nm to 70 nm tall). In other embodiments, note that the spacer can be patterned to provide three or more fins (such as in FIG. 2c or 2g), or only one fin (such as in FIG. 2h).

Figure 3G:
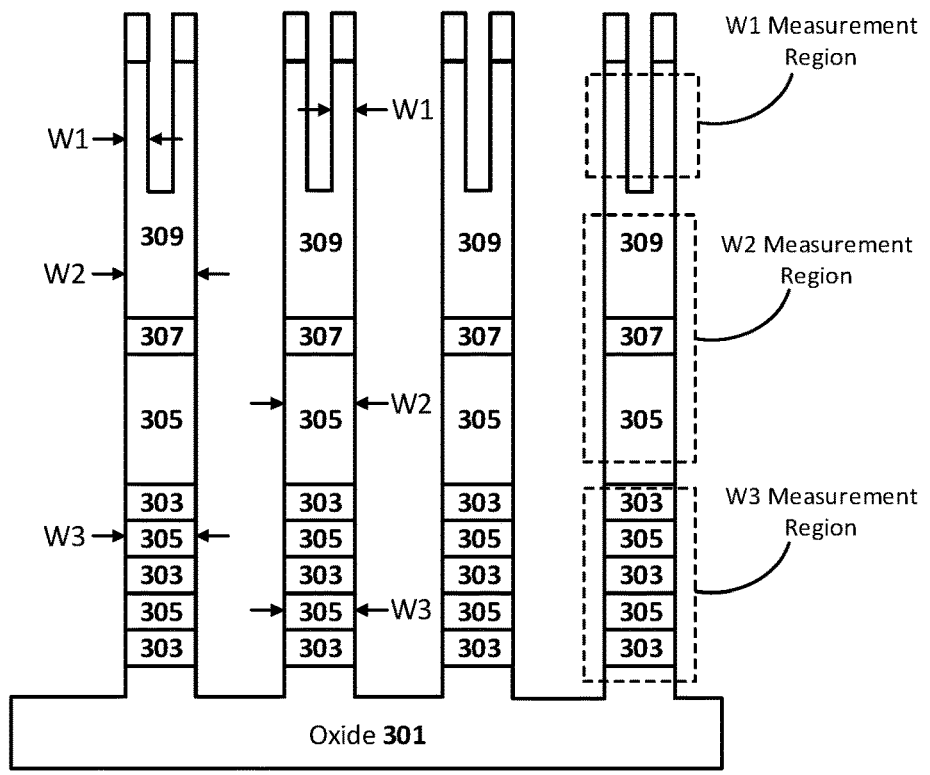

FIG. 3g shows the resulting structure after the insulator material 311 is removed or otherwise recessed, to provide access to the fin structures, particularly in the channel regions during dummy gate formation and/or final gate formation. Standard etching can be used (e.g., wet isotropic etch). The depth of the etch can vary from one embodiment to the next, and may extend into the oxide layer 301 (e.g., by 1 nm to 10 nm) as shown, although in other embodiments the etch may stop on the oxide layer 301. Further note that the spacer 315 is left on the fins in this example embodiment, to help protect the fins from subsequent processing, according to an embodiment.

In any case, the resulting fin structures include fins, nanowires, and/or nanoribbons in the top device region and the bottom device region, and those fins, nanowires, and/or nanoribbons have a width that is relatively much smaller (e.g., by 2 nm or more) than the width of the central region or pedestal of the overall fin structure that generally includes a portion of the semiconductor 309, isolation 307, and a portion of the semiconductor 305. In some embodiments that include a tapered overall fin structure that results from the etch process (such as shown in FIG. 3b), note that this narrower width of the fins, nanowires, and/or nanoribbons relative to the width of the central region or pedestal is intentional narrowing and is in addition to any further narrowing caused by said tapering (which may be unintentional).

Note that the width of the relatively narrower fins in the upper device region is measured, for instance, at a mid-portion of those fins (as generally shown at the W1 measurement region delineated with a dashed box, and with two specific example W1 measurement points). As will be appreciated, the topmost portion of the fins may be rounded, as may the bottom of the trough between the fins, so measuring the width outside those particular locations (top 3-5 nm and the bottom 3-5 nm of the fins) will assist in ensuring an accurate and representative width is measured. Likewise, the width of the relatively wider central region or pedestal is measured, for instance, at a mid-portion of those pedestals (as generally shown at the W2 measurement region delineated with a dashed box, and with two specific example W2 measurement points). In a similar fashion, the width of the nanoribbon structures in the lower device region is measured, for instance, at a mid-portion of those structures (as generally shown at the W3 measurement region delineated with a dashed box, and with two specific example W3 measurement points).

Figure 3H:
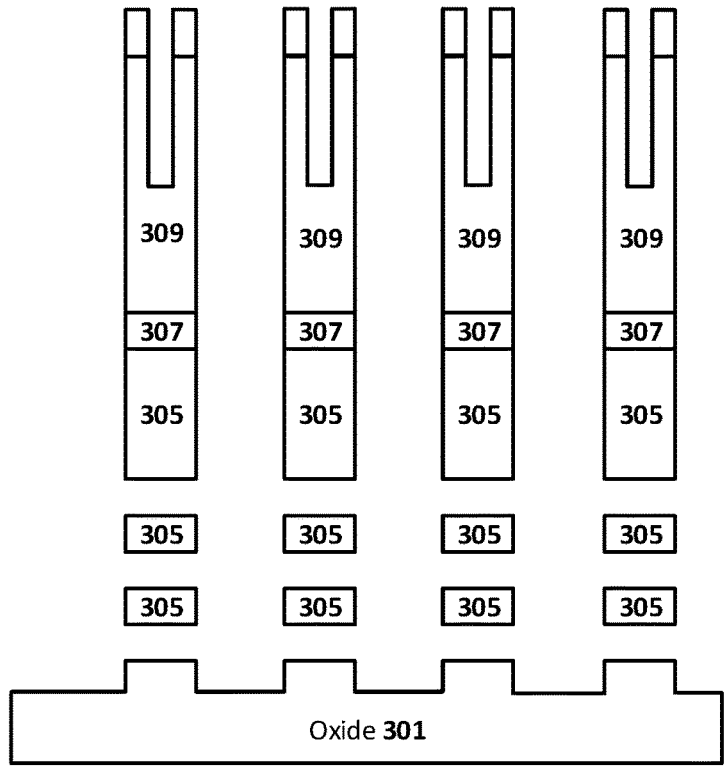

Now the resulting fin structures shown in FIG. 3g can be processed into devices, using gate-first or gate-last processing, source and drain processing, contact processing, and interconnect processing, as will now be discussed. FIG. 3h shows the resulting structure after the nanoribbons 305 have been released in the channel region of the lower device region, by removing sacrificial material 303. As previously explained, that release process can be, for example, part of a gate forming process where the channel region is first exposed by removing any dummy gate materials (if a gate-last process is used), followed by an etch that is selective to the nanoribbons 305 and not the sacrificial material 303 (i.e., the etch removes the sacrificial material 303 at a much higher rate than the nanoribbons 305 material). Note that the release is only carried out in the channel region and not necessarily in the source or drain regions. Any number of selective etch schemes can be used, as will be appreciated. For instance, in one example embodiment sacrificial material 303 is silicon and semiconductor material 305 is germanium or SiGe, and etch chemistries such as aqueous hydroxide chemistries, including ammonium hydroxide and potassium hydroxide, for example, may be utilized to selectively etch the silicon but leave the germanium-containing nanoribbons in place. In another example embodiment, sacrificial material 303 is germanium-containing material and semiconductor material 305 is silicon, and etch chemistries such as carboxylic acid/nitric acid/hydrogen fluoride chemistry, and citric acid/nitric acid/hydrogen fluoride, for example, may be utilized to selectively etch the germanium-containing material 303 but leave the silicon 305 in place.

Figure 3I:
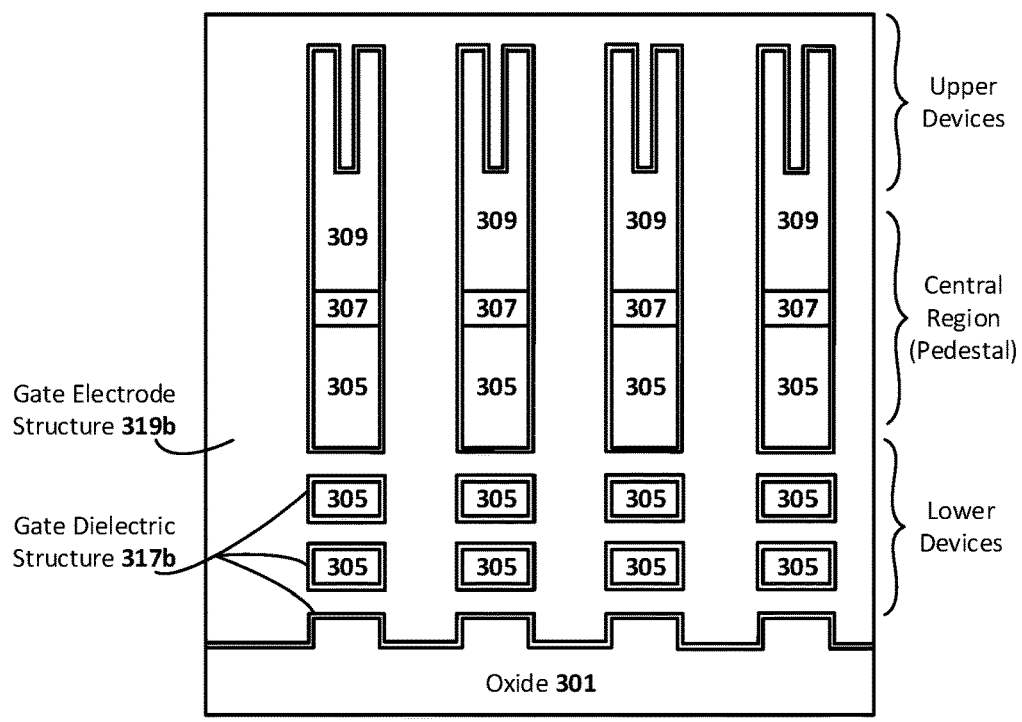

FIG. 3i shows the resulting structure after the lower device region gate stack is formed over the exposed channel regions. Standard gate structure deposition techniques can be used. As can be seen, the spacer 315 has been removed prior to gate stack deposition in this embodiment. In other embodiments, that spacer 315 may remain and be removed later in the process, as will be appreciated. Further note that the lower gate materials may be at least partially deposited onto the upper device region channel regions, which is ok as that gate material can be subsequently removed. As can be seen, the gate stack includes a gate dielectric 317b and a gate electrode 319b. The previous relevant discussion with respect to gate dielectrics 117a-b and gate electrodes 119a-b is equally applicable here, as will be appreciated.

Figure 3J:
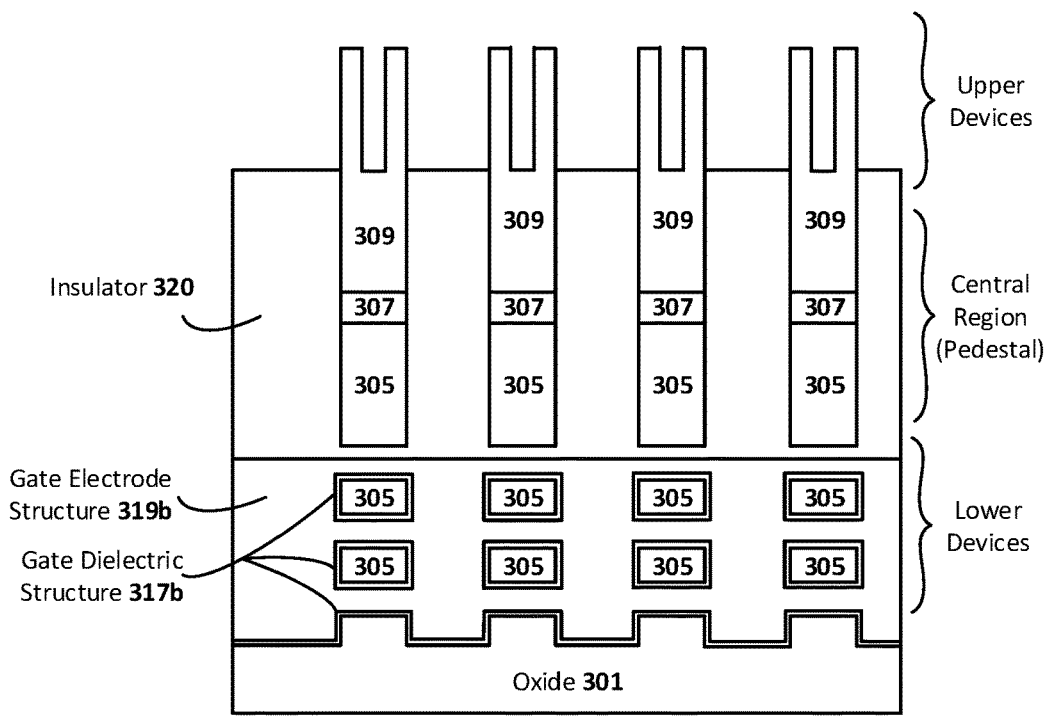

FIG. 3j shows the resulting structure after the lower gate stack materials are recessed or otherwise removed down to the lower device region, and the resulting trenches are then filled with insulator 320. The insulator 320 is then recessed to the base of the fins in the upper device region. Standard etch and deposition techniques can be used, as will be appreciated. FIG. 3k shows the resulting structure after the upper device region gate stack is formed over the exposed channel regions. The gate stack includes a gate dielectric structure 317a and a gate electrode structure 319a. The previous relevant discussion with respect to gate dielectrics 117a-b and gate electrodes 119a-b is equally applicable here, as will be appreciated.

Note how in this example embodiment that gate dielectrics 317a-b are conformal layers. In some such embodiments, the thickness of the gate dielectrics 317a-b is in the range of 5 angstroms to 5 nm (such as 1 nm or 2 nm). The gate electrodes 319a-b can of course be much thicker (e.g., 10 to 50 nm). FIG. 3l shows the resulting structure after the oxide layer 301 has been removed, along with the conformal gate dielectric 317b previously deposited thereon. FIG. 3l' shows another example embodiment, where the resulting structure is tapered somewhat, which might result for standard etch processes used to form the overall fin structure. Note the curved bottom of the trough between the top fins (etch schemes typically don't produce square corners in such a trough), as well as the trough between the fins being wider at the top of the fins than at the bottom of the fins due to the slight inward taper of the fins. Further note the bottom most nanoribbon 305 in the lower device region is effectively the widest part of the structure and the upper portion of the fins in the upper device region collectively are the narrowest part of the structure. As can be further seen, collinearity line A shows that the outermost sidewall of the upper left fin is collinear with both the left sidewall of the central region (including a portion of layer 309, layer 307, and the uppermost layer 305) and the left sidewalls of the lower nanoribbons 305. In a similar fashion, collinearity line B shows that the outermost sidewall of the upper right fin is collinear with both the right sidewall of the central region (including a portion of layer 309, layer 307, and the uppermost layer 305) and the right sidewalls of the lower nanoribbons 305. As can further be seen, angle T shows the degree of the taper, which may be in the range of, for example, 80° to 89.9°. Of course, FIG. 3l shows such collinearity lines running vertically (90°), but the present disclosure is not intended to be so limited. Numerous variations and configurations will be apparent.

Figure 3M:
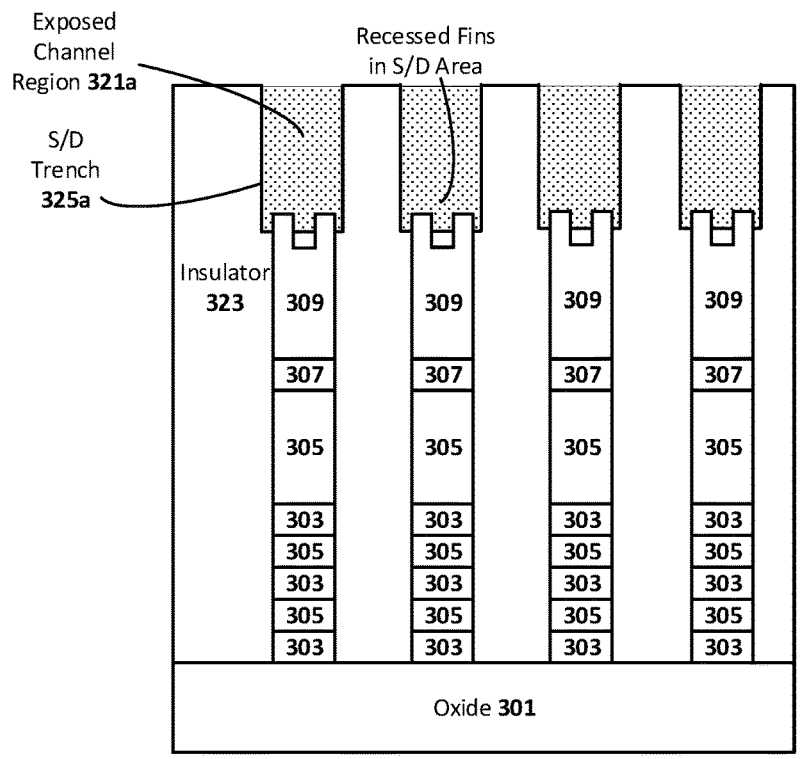

FIG. 3m shows a cross-section in the source/drain region. Note that in a gate-first process, the source/drain processing can be carried out after the final gate structure is formed. However, in a gate-last process, the source/drain processing is carried out before the final gate structure is formed (when dummy gate materials are present in the channel region). In the example embodiment shown, the source and drain regions to be processed are removed using a standard etch, so as to provide source/drain trenches 325a and to expose the adjacent channel region 321a. The etch can be, for example, a selective etch that etches the source/drain materials at a much higher rate than any other exposed materials of the structure. Alternatively, a mask can be patterned that isolates the source/drain regions to be processed, and protects other parts of the structure. As can be seen in this example embodiment of FIG. 3m, the etch removes almost all of the fins in the source/drain regions, but leaves fin stubs.

Figure 3N:
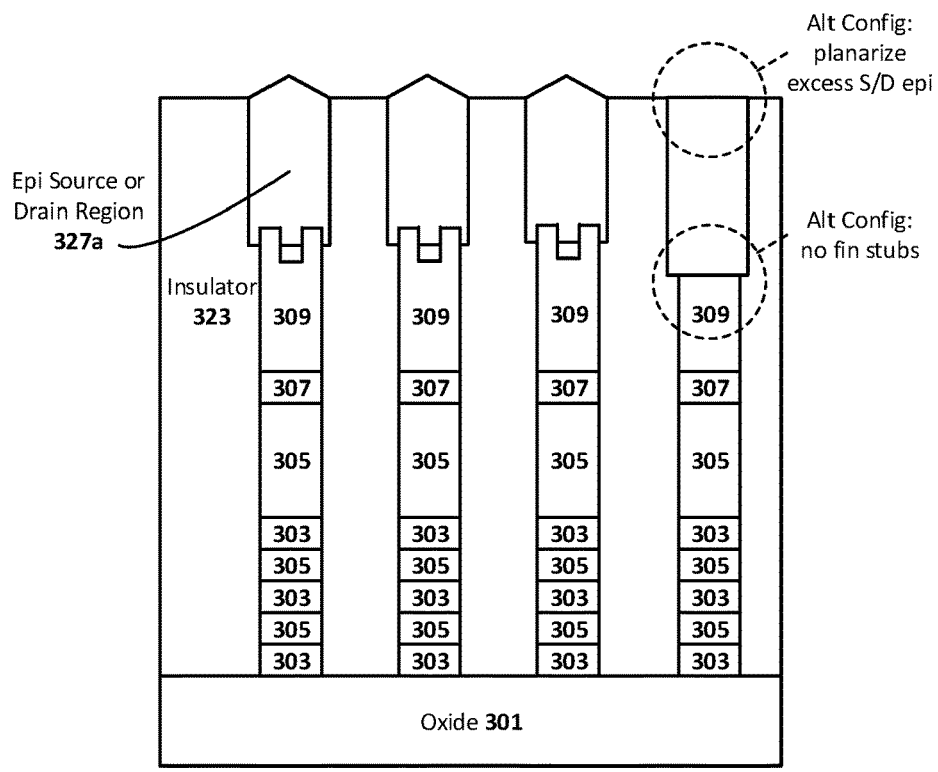

A source drain epitaxial deposition is then used to provide the epi source and drain regions 327a, as shown in FIG. 3n. Any suitable source/drain materials and deposition techniques can be used. In some such embodiments, the epi source/drain regions 327a have a faceted top surface, as shown on the three leftmost source/drain regions 327a. In other such embodiments, excess epi deposition can be removed by way of a planarization process (e.g., CMP), as shown in the alternate configuration on right side of FIG. 3n, which shows a relatively flat top surface of the source/drain region 327a. Further note that in other embodiments, no fin stubs are left behind, as shown in the alternate configuration on the right side of FIG. 3n, which shows a relatively flat interface between material 309 and epi source/drain 327a.

In still other embodiments, source/drain regions may be provided without using an etch and replace scheme. For instance, in some such cases, the fins in the source/drain regions can be exposed via a selective etch to form trenches 325a. An implantation doping scheme can then be utilized to dope the source/drain regions of the exposed fins as desired. Numerous source/drain forming techniques can be used, as will be appreciated in light of this disclosure.

Figure 3O:
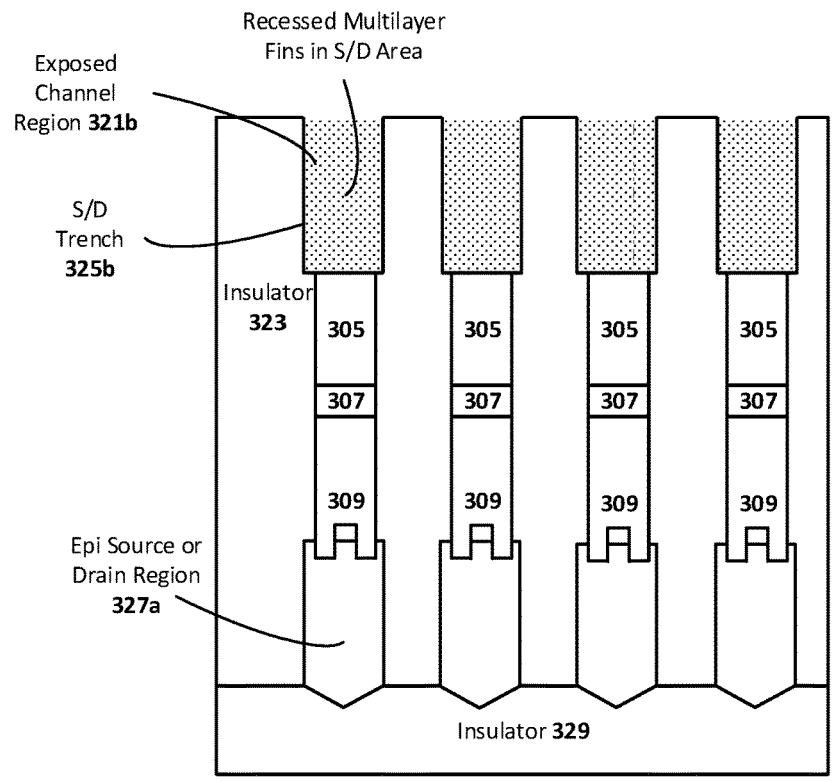
Figure 3P:
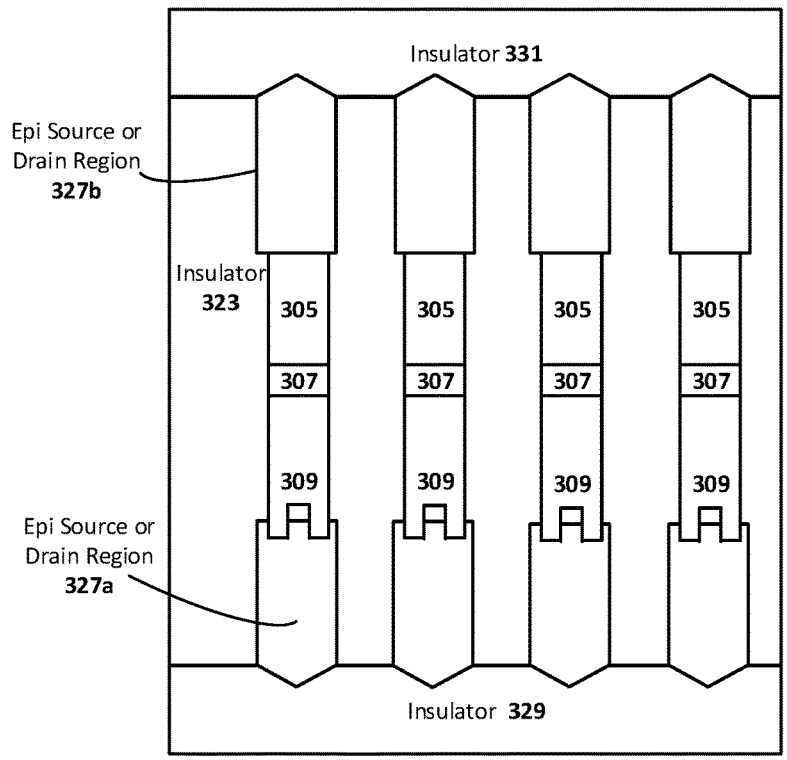

Now that the source/drain regions 327a of the upper device region are processed, the source/drain regions of the lower device region can be processed. So, as best shown in FIG. 3o, an insulator layer 329 is deposited and planarized over the source/drain regions 327a of the upper device region, and the structure is then inverted so as to provide access to the source/drain regions of the lower device region from the top of the structure. The same process used to provide source/drain regions 327a can be used to form source/drain regions 327b, and the previous relevant discussion is equally applicable here, as will be appreciated. In the example embodiment shown in FIG. 3o, the source and drain regions to be processed are removed using a standard etch, so as to provide source/drain trenches 325b and to expose the adjacent channel region 321b. A source drain epitaxial deposition is then used to provide the epi source and drain regions 327b, as shown in FIG. 3p. An insulator layer 331 is deposited and planarized over the source/drain regions 327b of the lower device region. Source and drain contact structures can then be formed in the insulator layers 329 and 331, using standard contact forming processes. The previously relevant discussion with respect source/drain contact structures 133a-b is equally applicable here.

Figure 4A:
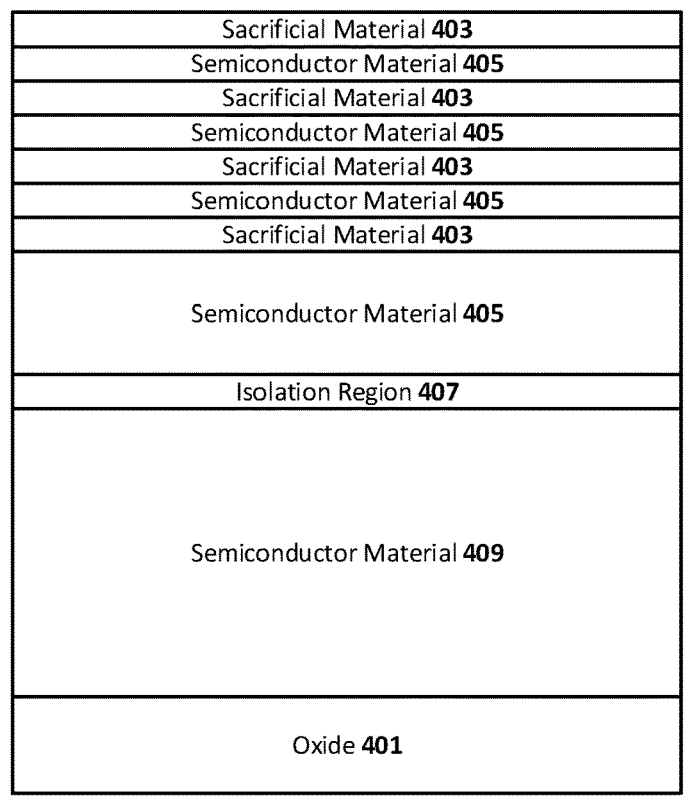
FIGS. 4a though 4l' are cross-sections views illustrating another process for forming an integrated circuit including a stacked transistor structure having a wide central pedestal region and at least one narrow channel region above and/or below the pedestal region, in accordance with various embodiments of the present disclosure. The cross-section in FIGS. 4a-4l' is taken parallel to and through the gate line of the structure.

FIGS. 4a though 4l' are cross-sections views illustrating another process for forming an integrated circuit including a stacked transistor structure having a wide central pedestal region with nanowires in the top device region and multiple fins in the lower device region, in accordance with various embodiments of the present disclosure. As can be seen in the example embodiment of FIG. 4a, the process begins with providing a relatively thick semiconductor layer 409 over an oxide layer 401, followed by alternating layers of semiconductor material 405 and sacrificial material 403. Isolation region 407 is generally between or otherwise at the interface of the bottommost layer 405 and layer 409. The previous relevant discussion provided with respect to FIGS. 3a regarding materials, layer thicknesses, deposition techniques, isolation region 407, and the role of materials 403 and 405 being reversible depending the type of transistor being formed, is equally applicable here.

Figure 4B:
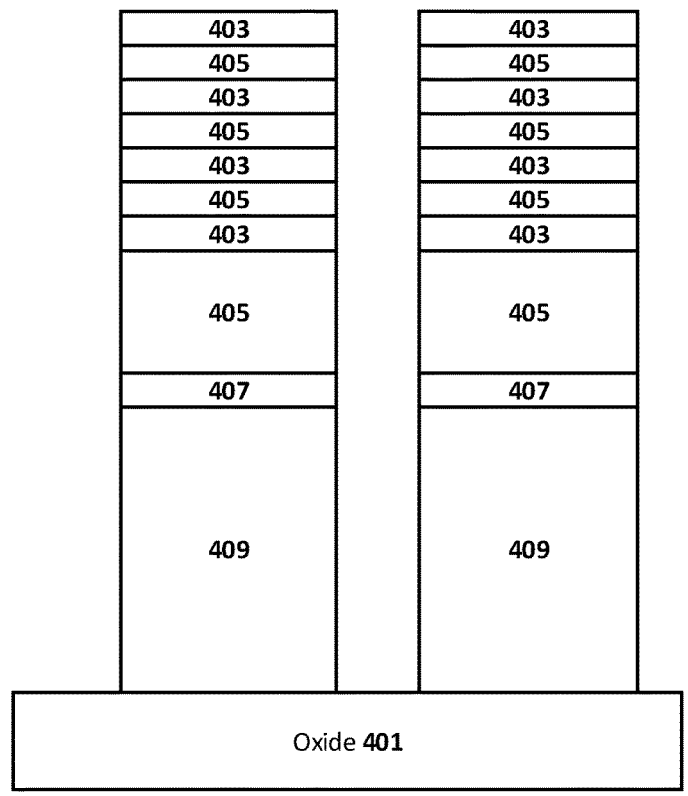

FIG. 4b shows the resulting structure after fin structures have been patterned and etched, according to an embodiment. As can be seen, two fin structures are shown, but any number of such fin structures can be made. The previous relevant discussion provided with respect to FIG. 3b regarding masking and etch techniques, etch depth, and fin structure shape is equally applicable here.

Figure 4C:
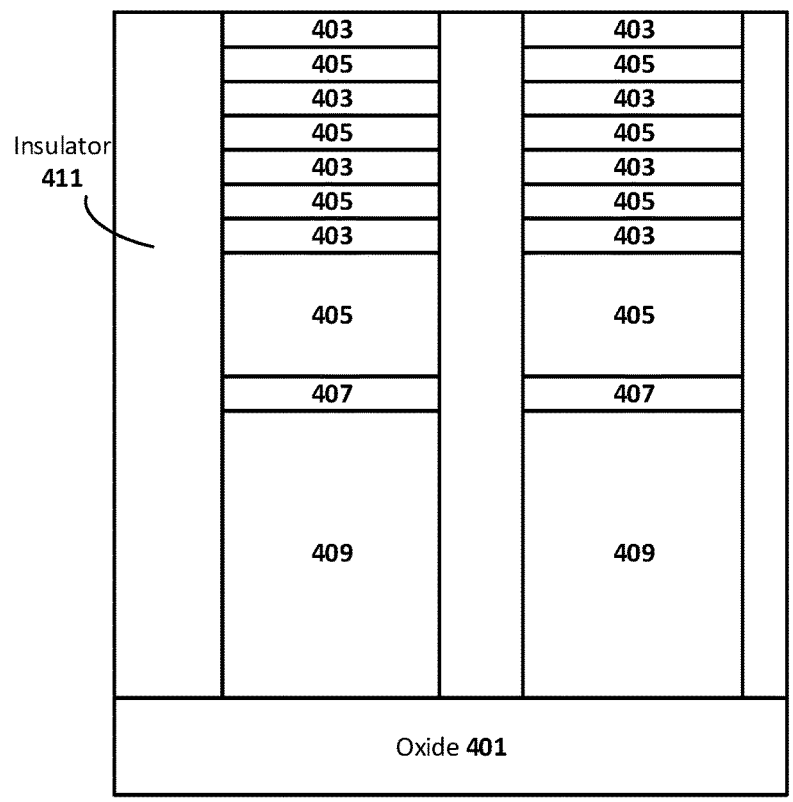

FIG. 4c shows the resulting structure after an insulator 411 is deposited into the trenches between the fin structures and planarized. The previous relevant discussion provided with respect to FIG. 3c regarding example insulator materials is equally applicable here.

Figure 4D:
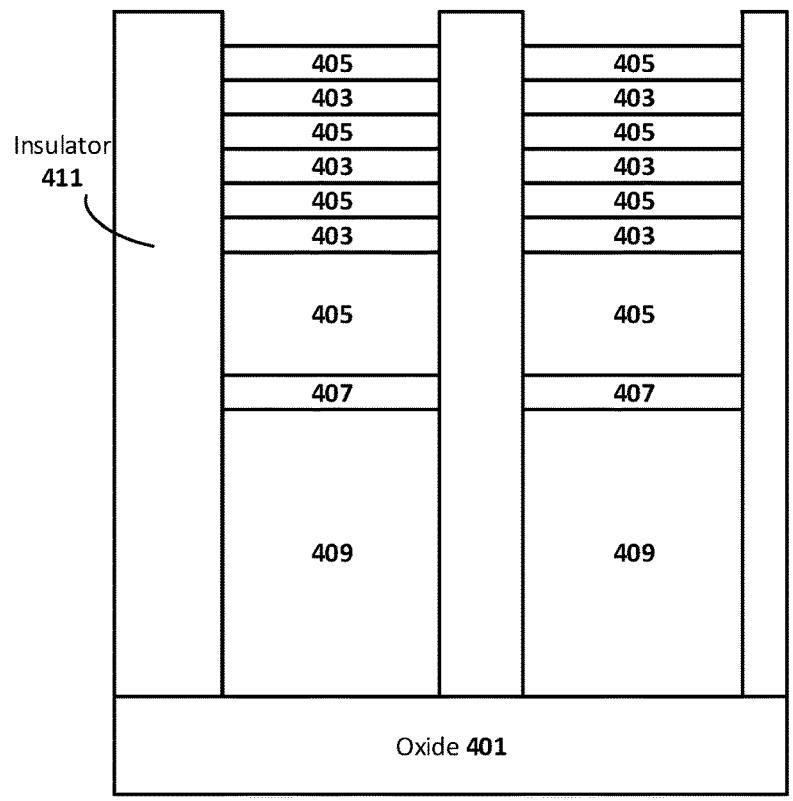
Figure 4E:
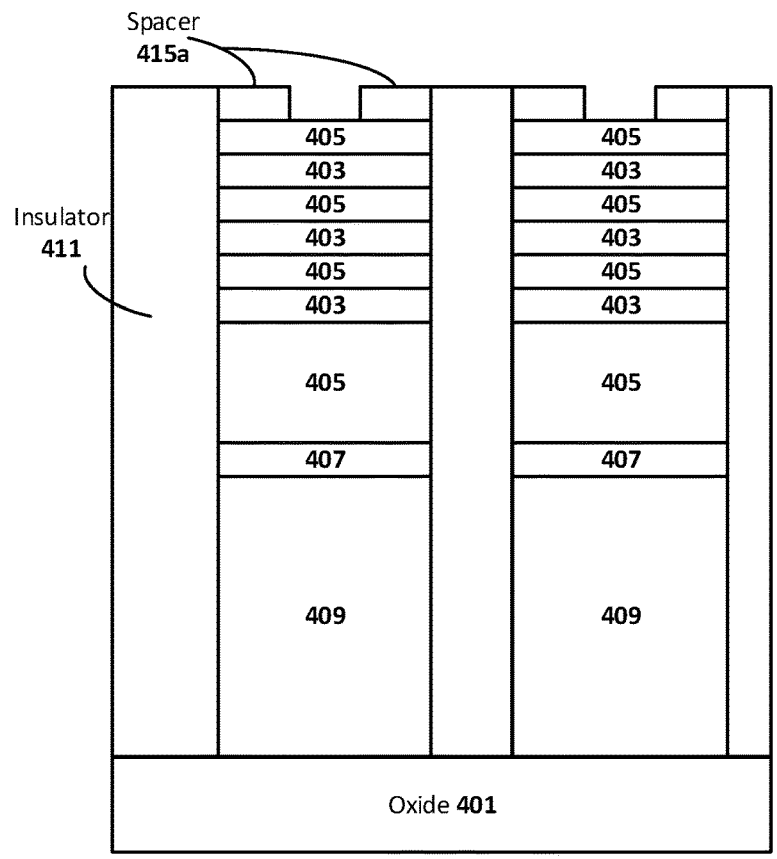

FIG. 4d shows the resulting structure after the fin structures have been recessed to allow for spacer formation, and FIG. 4e shows the resulting structure after spacer 415a has been formed within the recess on top of the fin structures. The previous relevant discussion provided with respect to FIGS. 3d-e regarding etch and masking schemes suitable for recessing the fin structures, recess depth, and spacer formation and materials is equally applicable here.

Figure 4F:
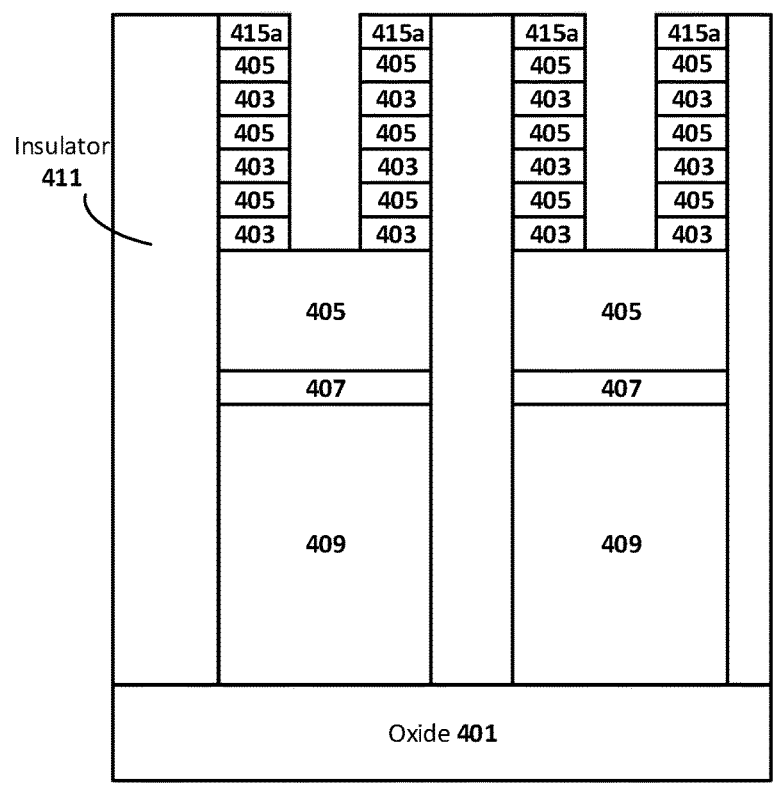

FIG. 4f shows the resulting structure after the top portion including the alternating layers of 403 and 405 is etched into two multilayer fin structures, using the patterned spacer 415a. Standard etching can be used (e.g., dry anisotropic etch to provide relatively rectangular fin structures, although some taper may occur which is fine). The depth of the etch can vary from one embodiment to the next, but largely depends on the desired height of the multilayer fin structures in the upper device region (and more specifically, the number of nanowires in the upper channel region). In some embodiments, the depth of the etch is in the range of 20 nm to 70 nm (so as to provide fin structures that are about 20 nm to 70 nm tall). In other embodiments, note that the spacer can be patterned to provide three or more fin structures (such as in FIG. 2e), or only one fin structure (such as in FIG. 2h, where the fin is a multilayer fin structure that includes alternating layers of 403 and 405 materials). Further note in the example embodiment shown in FIG. 4f that the etch stops on top of the relatively thicker bottommost layer 405, but in other embodiments may extend into that layer 405 to some extent (e.g., 1 to 10 nm). Alternatively, the etch may stop on or within one of the relatively thinner alternating 403, 405 layers, such as on or within the bottommost layer 403 or the bottommost layer 405 just above the bottommost layer 403. The previous discussion of FIG. 3f' with respect to tapering of the fin structure sidewalls and curved trough bottom is equally applicable here. So, for instance, the uppermost nanowire layer 405 may be wider than the bottommost nanowire layer 405, and the inside corners of the bottommost 403 layers may slope inward toward each other, to provide a curved trough bottom.

Figure 4G:
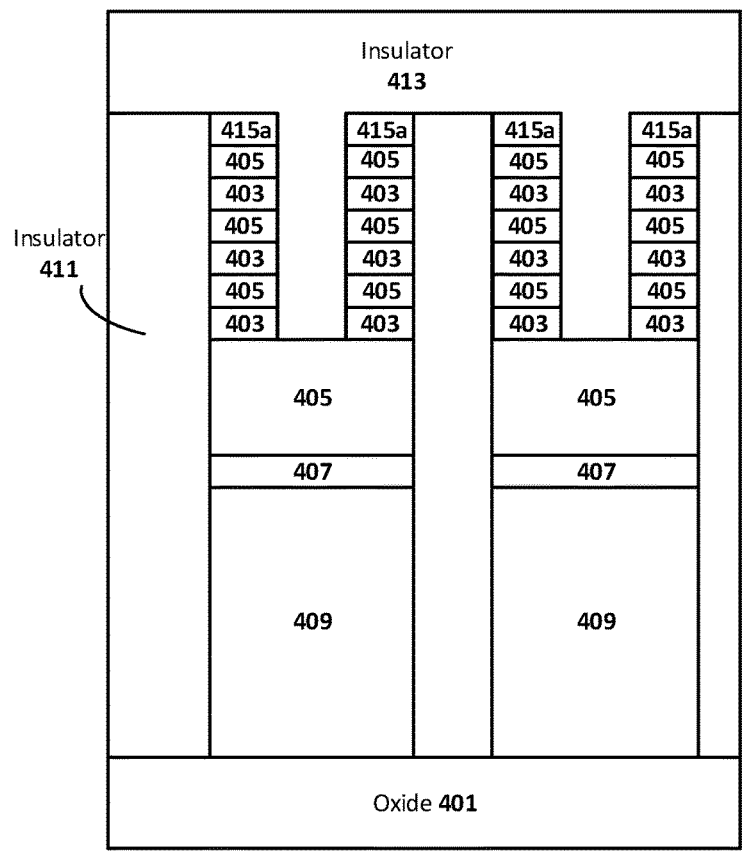

FIG. 4g shows the resulting structure after insulator material 413 is deposited to planarize the structure so that the overall structure can be inverted to allow for processing of material 409 into fins. The thickness of insulator material 413 can vary from one embodiment to the next but in some example cases is in the range of 25 to 300 nm. Insulator material 413 can be, for instance, the same material as insulator 411 (e.g., silicon dioxide, silicon nitride, silicon carbide, to name a few examples). In other embodiments, insulator 413 may be compositionally different than insulator 411, so as to allow for etch selectivity between the two distinct materials. In any such cases, standard deposition techniques can be used.

Figure 4H:
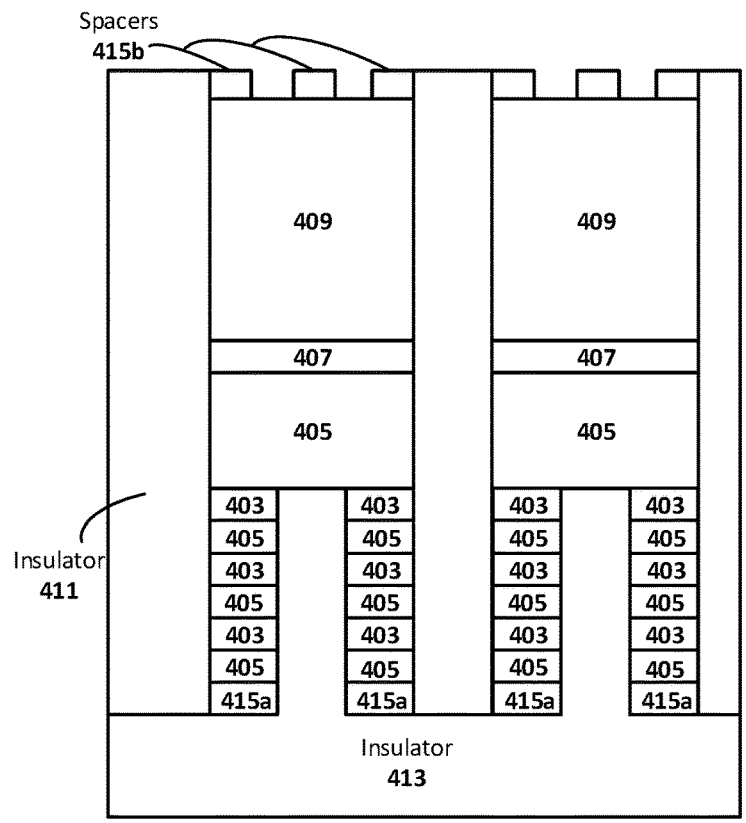

FIG. 4h shows the resulting structure, inverted with respect to FIG. 4g, after layer 409 has been recessed to allow for spacer formation, and after the spacer 415b has been formed within the recess on top of layer 409. The previous relevant discussion provided with respect to FIGS. 3d-e regarding etch and masking schemes suitable for recessing the fin structures, recess depth, and spacer formation and materials is equally applicable here, as will be appreciated.

Figure 4I:
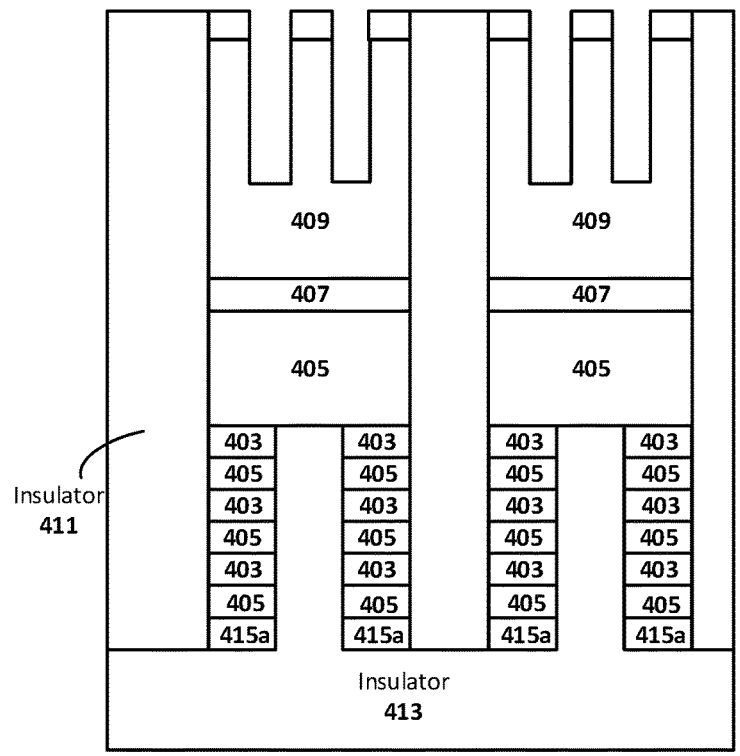
Figure 4J:
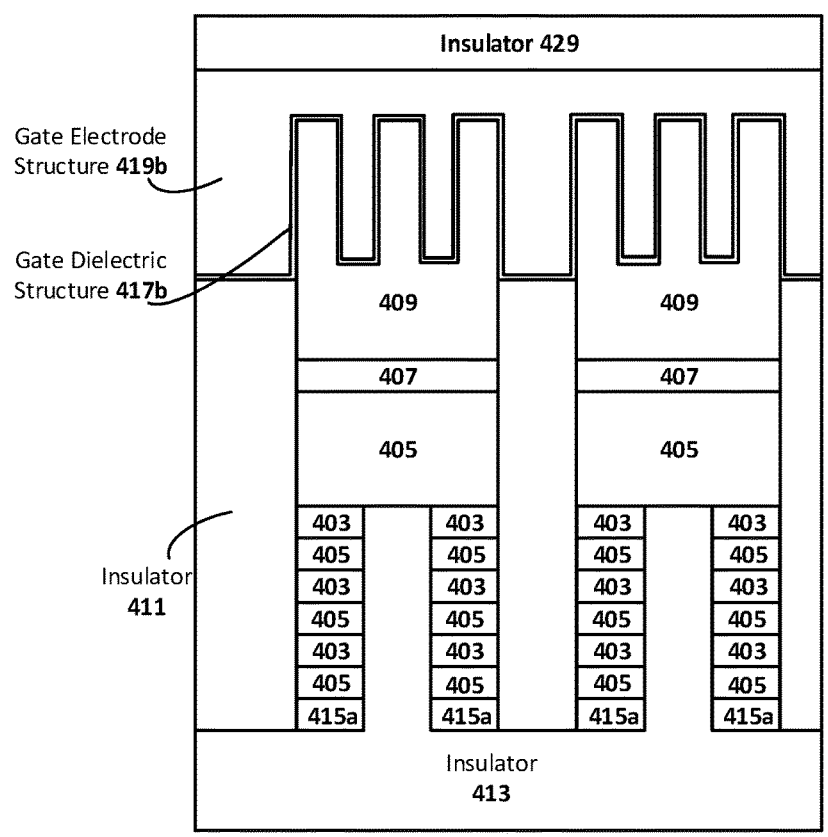

FIG. 4i shows the resulting structure after the top portion of layer 409 is etched into three fins, using the patterned spacer 415b, and FIG. 4j shows the resulting structure after insulator 411 has been recessed to expose the channel region of the fins, so as to allow for gate processing. As can be seen, the spacer 415b has been removed prior to gate structure formation, and the resulting gate structure includes gate dielectric 417b and gate electrode 419b. The previous relevant discussion with respect to FIG. 3f regarding etch schemes, etch depth, and fin shape, as well as with respect to gate formation and materials, is equally applicable here. Insulator layer 429 is deposited to planarize the structure so that the overall structure can be inverted to allow for processing of the fin structures (which include alternating layers of 403 and 405 materials) into nanowires. The previous relevant discussion with respect to insulator material 413 regarding thickness, materials, and deposition techniques, is equally applicable here. Also, the previous discussion with respect to tapering of the fin sidewalls and curved trough bottom is equally applicable here. So, for instance, the distance between the two outermost fin sidewalls near the top of the fins may be narrower than the bottommost portion of layer 409 and layer 407, and the inside corners of the trough bottoms between the fins may slope inward toward each other, to provide curved trough bottoms.

Figure 4K:
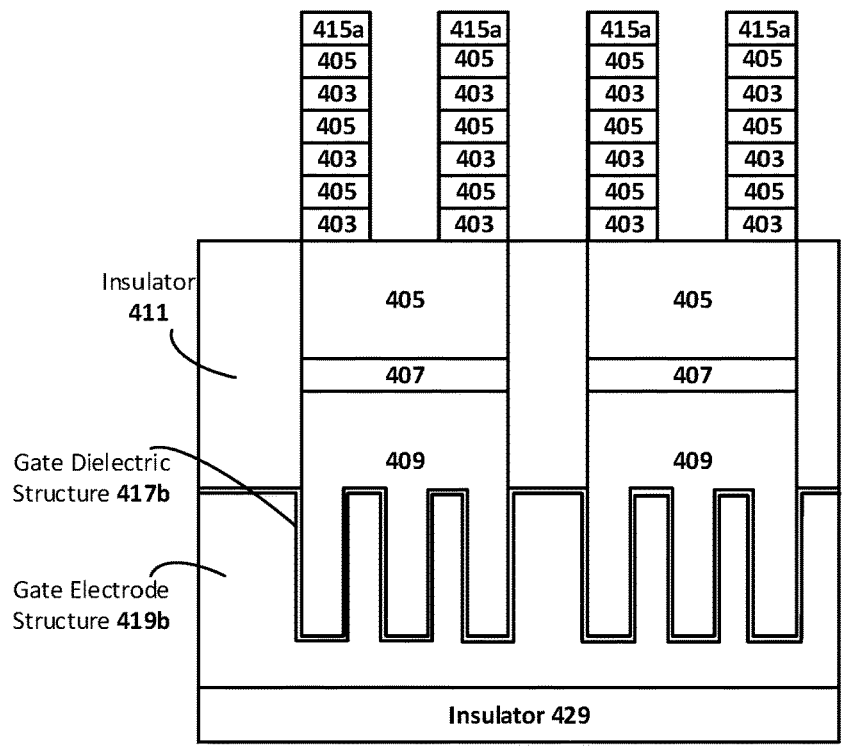

FIG. 4k shows the resulting structure, inverted with respect to FIG. 4j, after layer 409 has been recessed to allow for spacer formation, and after insulator material 413 has been removed, and after insulator layer 411 has been recessed, so as to expose the fin structures in the channel region for gate processing. As will be appreciated, only the portion of the fin structures making up the channel region are exposed to allow for such gate processing (e.g., source/drain regions of the fin structures may remain encased in insulator material). The previous relevant discussion with respect to etch techniques, recess depth, and use of spacer 415a to protect fin structures during the removal/recess of insulator materials 413/411 is equally applicable here.

Figure 4L:
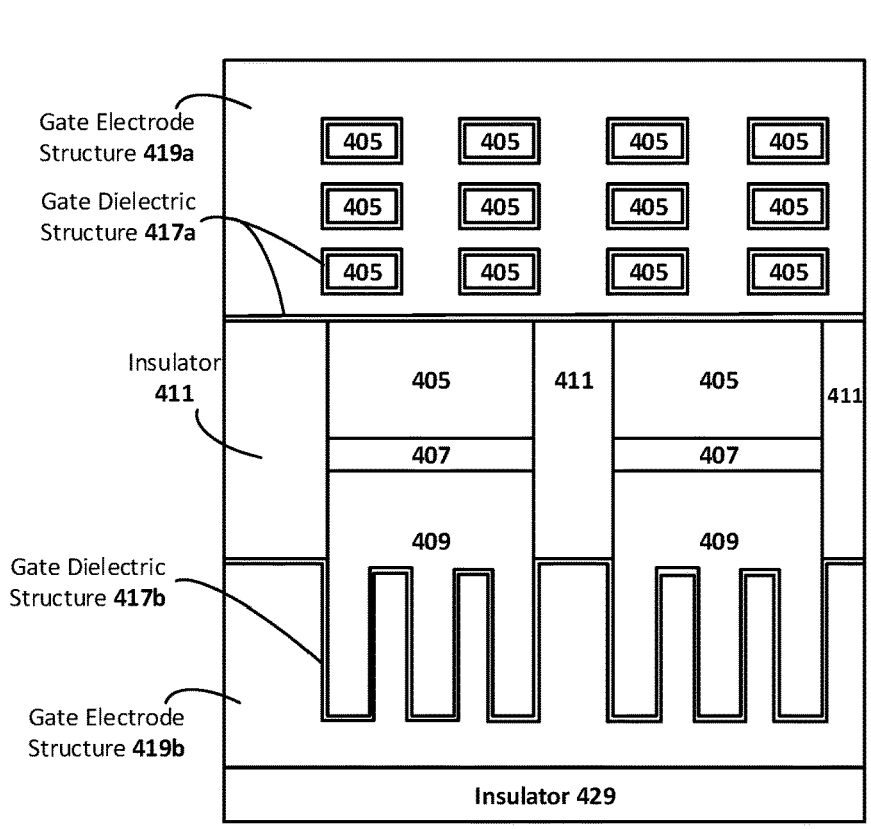
Figure 4L:
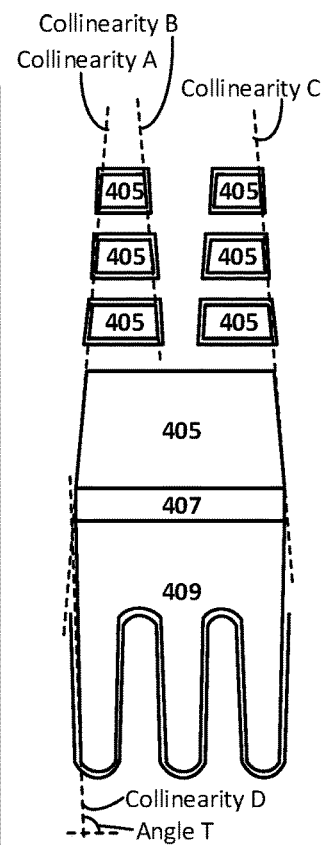

FIG. 4l shows the resulting structure after the nanowires 405 have been released in the channel region, by removing sacrificial material 403. As previously explained, that release process can be, for example, part of a gate forming process where the channel region is first exposed by removing any dummy gate materials (if a gate-last process is used), followed by an etch that is selective to the nanowires 405 and not the sacrificial material 403). The previous relevant discussion with respect to example materials systems and selective etch schemes for the nanowire release process is equally applicable here. As can be further seen, the spacer 415 has been removed prior to gate stack deposition, and the gate stack includes a gate dielectric 417a and a gate electrode 419a. The previous relevant discussion with respect to gate dielectrics 117a-b and gate electrodes 119a-b is equally applicable here, as will be appreciated.

FIG. 4l' shows another example embodiment, where the top portion of the resulting structure is tapered in a first manner and the bottom portion of the resulting structure is tapered in a second manner, which may result from the forming process, as will be appreciated. In such cases, the central region is the widest part of the overall structure, and an inward taper occurs in both the upward direction and the downward direction. As can be seen, collinearity line A shows that the outermost sidewalls of the upper left nanowires are collinear with only the left sidewall of the central region (including a portion of layer 409, layer 407, and the lowermost layer 405), and not with the lower left fin. In a similar fashion, collinearity line B shows that the outermost sidewalls of the upper right nanowires are collinear with only the right sidewall of the central region (including a portion of layer 309, layer 307, and the uppermost layer 305), and not the lower right fin. In a similar fashion, collinearity line D shows that the outermost sidewall of the lower left fin is collinear with only the right sidewall of the central region (including a portion of layer 309, layer 307, and the uppermost layer 305), and not the upper left nanowires. Collinearity line B shows internal collinearity in this example embodiment. As can further be seen, angle T shows the degree of the taper, which may be in the range of, for example, 80° to 89.9°. FIG. 4l shows such collinearity lines running vertically (90°), but the present disclosure is not intended to be so limited, as previously noted.

Source and drain region processing and contact formation can then be carried out in a similar fashion to that previously described with reference to FIGS. 3m-3p, and that relevant discussion is equally applicable here.

Computing System

Figure 5:
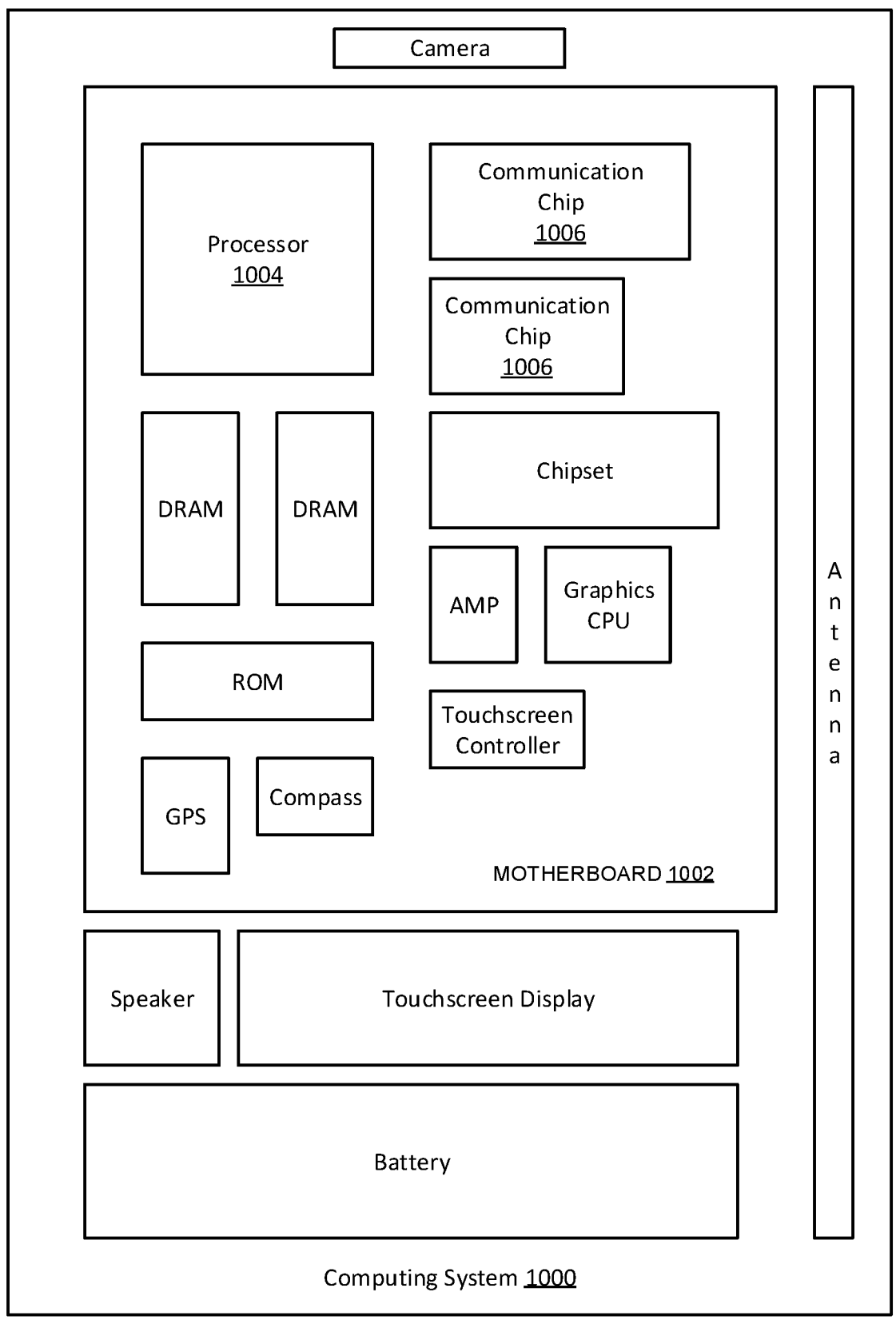
FIG. 5 illustrates a computing system implemented with one or more integrated circuit structures configured in accordance with an embodiment of the present disclosure.

FIG. 5 illustrates a computing system implemented with one or more integrated circuit structures configured in accordance with an embodiment of the present disclosure. As can be seen, the computing system 1000 houses a motherboard 1002. The motherboard 1002 may include a number of components, including but not limited to a processor 1004 and at least one communication chip 1006 (two are shown in this example), each of which can be physically and electrically coupled to the motherboard 1002, or otherwise integrated therein. As will be appreciated, the motherboard 1002 may be, for example, any printed circuit board, whether a main board or a daughterboard mounted on a main board or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuits configured with a stacked transistor structure having a wide central pedestal region and at least one relatively narrower channel region above and/or below a wider central pedestal region, as variously described herein. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others. The processor 1004 of the computing system 1000 includes an integrated circuit die packaged within the processor 1004. In some example embodiments of the present disclosure, the integrated circuit die of the processor 1004 includes one or more stacked transistor structures as variously provided herein. The term "processor" may refer to any device or portion of a device that processes, for instance, electronic data from registers and/or memory to transform that electronic data into other electronic data that may be stored in registers and/or memory.

The communication chip 1006 may also include an integrated circuit die packaged within the communication chip 1006. In accordance with some such example embodiments, the integrated circuit die of the communication chip 1006 includes one or more stacked transistor structures as variously provided herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 1000 may be any other electronic device that processes data or employs one or more stacked transistor structures as variously provided herein. As will be appreciated in light of this disclosure, various embodiments of the present disclosure can be used to improve performance on products fabricated at any process node (e.g., in the micron range, or sub-micron and beyond) by allowing for the use of vertically stacked transistors having any number of source/drain configurations and channel configurations (e.g., Si, Ge, SiGe, multi-layer structure of Si and SiGe, III-V such as gallium nitride or InGaAs, a semiconducting oxide such as nickel oxide or IGZO, and/or combinations thereof).

Further Example Embodiments

The following examples pertain to further embodiments, from which numerous permutations and configurations will be apparent.

Example 1 includes an integrated circuit structure, comprising: a body comprising one or more semiconductor materials and having a first width defined by a distance between opposing sidewalls of the body; a first transistor above the body and including a first fin, nanowire, or nanoribbon, the first fin, nanowire, or nanoribbon having a second width defined by a distance between opposing sidewalls of the first fin, nanowire, or nanoribbon; and a second transistor below the body and including a second fin, nanowire, or nanoribbon, the second fin, nanowire, or nanoribbon having a third width defined by a distance between opposing sidewalls of the second fin, nanowire, or nanoribbon; wherein one or both of the second and third widths is at least 1.5 times less than the first width.

Example 2 includes the subject matter of Example 1, wherein one or both of the second and third widths is at least 2 times less than the first width.

Example 3 includes the subject matter of Example 1 or 2, wherein one or both of the second and third widths is at least 2.5 times less than the first width.

Example 4 includes the subject matter of any of the previous Examples, wherein one or both of the second and third widths is at least 3 times less than the first width.

Example 5 includes the subject matter of any of the previous Examples, wherein the body includes first and second portions that are distinct from one another, and the one or more semiconductor materials of the body include a first semiconductor material in the first portion of the body and a second semiconductor material compositionally different from the first semiconductor material and in the second portion of the body.

Example 6 includes the subject matter of any of the previous Examples, wherein one of the opposing sidewalls of one or both of the first fin, nanowire, or nanoribbon and the second fin, nanowire, or nanoribbon is collinear with a corresponding one of the opposing sidewalls of the body.

Example 7 includes the subject matter of any of the previous Examples, wherein one or both of the first fin, nanowire, or nanoribbon and the second fin, nanowire, or nanoribbon is compositionally distinct from the body.

Example 8 includes the subject matter of any of the previous Examples, wherein one or both of the first fin, nanowire, or nanoribbon and the second fin, nanowire, or nanoribbon is a fin.

Example 9 includes the subject matter of any of the previous Examples, wherein one or both of the first fin, nanowire, or nanoribbon and the second fin, nanowire, or nanoribbon is a nanowire.

Example 10 includes the subject matter of any of the previous Examples, wherein one or both of the first fin, nanowire, or nanoribbon and the second fin, nanowire, or nanoribbon is a nanoribbon.

Example 11 includes the subject matter of any of the previous Examples, wherein the first fin, nanowire, or nanoribbon is a fin, and the second fin, nanowire, or nanoribbon is a nanowire or a nanoribbon.

Example 12 includes the subject matter of any of the previous Examples, wherein the opposing sidewalls of at least one of the first and second fin, nanowire, or nanoribbon are tapered.

Example 13 includes the subject matter of any of the previous Examples, wherein the opposing sidewalls of both the first and second fin, nanowire, or nanoribbon are tapered.

Example 14 includes the subject matter of any of the previous Examples, wherein the opposing sidewalls of the first fin, nanowire, or nanoribbon are not collinear with the opposing sidewalls of the second fin, nanowire, or nanoribbon.

Example 15 includes the subject matter of any of the previous Examples, wherein: the opposing sidewalls of both the first and second fin, nanowire, or nanoribbon are tapered; the opposing sidewalls of the first fin, nanowire, or nanoribbon are not collinear with the opposing sidewalls of the second fin, nanowire, or nanoribbon; and one of the opposing sidewalls of both of the first fin, nanowire, or nanoribbon and the second fin, nanowire, or nanoribbon is collinear with a corresponding one of the opposing sidewalls of the body.

Example 16 includes the subject matter of Example 15, wherein the first fin, nanowire, or nanoribbon is a fin, and the second fin, nanowire, or nanoribbon is a nanoribbon.

Example 17 includes the subject matter of any of the previous Examples, wherein the first transistor is a PMOS transistor and the second transistor is an NMOS transistor. Alternatively, wherein the first transistor is an NMOS transistor and the second transistor is a PMOS transistor.

Example 18 includes the subject matter of any of the previous Examples, wherein the integrated circuit structure is part of a computing system. The computing system may be, for instance, a mobile communication device such as a mobile phone, smart phone, tablet, or laptop computer. In other cases, the computing system may be a desktop or workstation computer, or a game console. In still other cases, the computing system may be a single board computer or control unit associated with a piece of equipment or system. Any number of computing environments will be appreciated.

Example 19 is an integrated circuit structure, comprising: a body comprising one or more semiconductor materials and having a first width defined by a distance between opposing sidewalls of the body; a first transistor structure above the body and including a first plurality of fins, nanowires, or nanoribbons, the first transistor structure including a first gate structure, a first source region, and a first drain region; and a second transistor structure below the body and including a second plurality of fins, nanowires, or nanoribbons, the second transistor structure including a second gate structure, a second source region, and a second drain region; wherein one or more of the fins, nanowires, or nanoribbons of the first plurality has a second width, and one or more of the fins, nanowires, or nanoribbons of the second plurality has a third width, one or both of the second and third widths being at least 1.5 times less than the first width; and wherein the opposing sidewalls of the body are collinear with an outermost sidewall included in the first plurality of fins, nanowires, or nanoribbons and/or an outermost sidewall included in the second plurality of fins, nanowires, or nanoribbons. FIGS. 3*l'* and 4*l'* show example such scenarios.

Example 20 includes the subject matter of Example 19, wherein one or both of the second and third widths is at least 2 times less than the first width.

Example 21 includes the subject matter of Example 19 or 20, wherein the body includes first and second portions that are compositionally distinct from one another, and the one or more semiconductor materials of the body include a first semiconductor material in the first portion of the body and a second semiconductor material compositionally different from the first semiconductor material and in the second portion of the body, and wherein one or both of the first and second pluralities includes fins, nanowires, or nanoribbons are compositionally distinct from the body.

Example 22 includes the subject matter of any of Examples 19 through 21, wherein the outermost sidewall included in the first plurality of fins, nanowires, or nanoribbons is collinear with the outermost sidewall included in the second plurality of fins, nanowires, or nanoribbons.

Example 23 includes the subject matter of any of Examples 19 through 22, wherein the opposing sidewalls of the body are collinear with the outermost sidewall included in the first plurality of fins, nanowires, or nanoribbons and the outermost sidewall included in the second plurality of fins, nanowires, or nanoribbons.

Example 24 includes the subject matter of any of Examples 19 through 23, wherein one or both of the first and second pluralities includes fins.

Example 25 includes the subject matter of any of Examples 19 through 24, wherein the first plurality of fins, nanowires, or nanoribbons includes fins, and the second plurality of fins, nanowires, or nanoribbons includes nanowires or nanoribbons.

Example 26 includes the subject matter of any of Examples 19 through 25, wherein the first transistor structure includes a PMOS transistor and the second transistor structure includes an NMOS transistor.

Example 27 includes the subject matter of any of Examples 19 through 26, wherein the integrated circuit structure is part of a computing system.

Example 28 includes the subject matter of any of Examples 19 through 27, wherein the integrated circuit structure is part of a processor. The processor may in turn be part of a chip-set, or a mother board, or controller, in some example such cases.

Example 29 includes the subject matter of any of Examples 19 through 28, wherein the integrated circuit structure is part of a communications chip. The communication chip may in turn be part of a chip-set, or a mother board, or a modem, or controller, in some example such cases.

Example 30 is method for forming an integrated circuit device, the method comprising: forming a body comprising one or more semiconductor materials and having a first width defined by a distance between opposing sidewalls of the body; forming a first transistor above the body and including a first fin, nanowire, or nanoribbon, the first fin, nanowire, or nanoribbon having a second width defined by a distance between opposing sidewalls of the first fin, nanowire, or nanoribbon; forming a second transistor below the body and including a second fin, nanowire, or nanoribbon, the second fin, nanowire, or nanoribbon having a third width defined by a distance between opposing sidewalls of the second fin, nanowire, or nanoribbon; wherein one or both of the second and third widths is at least 1.5 times less than the first width.

Example 31 includes the subject matter of Example 30, wherein one or both of the second and third widths is at least 2 times less than the first width.

Example 32 includes the subject matter of Example 30 or 31, wherein the body includes first and second portions that are compositionally distinct from one another, and the one or more semiconductor materials of the body include a first semiconductor material in the first portion of the body and a second semiconductor material compositionally different from the first semiconductor material and in the second portion of the body.

Example 33 includes the subject matter of any of Examples 30 through 32, wherein one of the opposing sidewalls of one or both of the first fin, nanowire, or nanoribbon and the second fin, nanowire, or nanoribbon is collinear with a corresponding one of the opposing sidewalls of the body.

Example 34 includes the subject matter of any of Examples 30 through 33, wherein one or both of the first fin, nanowire, or nanoribbon and the second fin, nanowire, or nanoribbon is compositionally distinct from the body.

Example 35 includes the subject matter of any of Examples 30 through 34, wherein the first fin, nanowire, or nanoribbon is a fin, and the second fin, nanowire, or nanoribbon is a nanowire or a nanoribbon.

The foregoing description of example embodiments of the present disclosure has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto.

What is claimed is:

1. An integrated circuit structure, comprising:
   a body comprising one or more semiconductor materials and having a first width defined by a distance between opposing sidewalls of the body;
   a first transistor vertically over the body and including a first fin, nanowire, or nanoribbon, the first fin, nanowire, or nanoribbon having a second width defined by a distance between opposing sidewalls of the first fin, nanowire, or nanoribbon; and
   a second transistor vertically beneath the body and including a second fin, nanowire, or nanoribbon, the second fin, nanowire, or nanoribbon having a third width defined by a distance between opposing sidewalls of the second fin, nanowire, or nanoribbon;
   wherein one or both of the second and third widths is at least 1.5 times less than the first width.

2. The integrated circuit structure of claim 1, wherein one or both of the second and third widths is at least 2 times less than the first width.

3. The integrated circuit structure of claim 1, wherein the body includes first and second portions that are distinct from one another, and the one or more semiconductor materials of the body include a first semiconductor material in the first portion of the body and a second semiconductor material compositionally different from the first semiconductor material and in the second portion of the body.

4. The integrated circuit structure of claim 1, wherein one of the opposing sidewalls of one or both of the first fin, nanowire, or nanoribbon and the second fin, nanowire, or nanoribbon is collinear with a corresponding one of the opposing sidewalls of the body.

5. The integrated circuit structure of claim 1, wherein one or both of the first fin, nanowire, or nanoribbon and the second fin, nanowire, or nanoribbon is compositionally distinct from the body.

6. The integrated circuit structure of claim 1, wherein the first fin, nanowire, or nanoribbon is a fin, and the second fin, nanowire, or nanoribbon is a nanowire or a nanoribbon.

7. The integrated circuit structure of claim 1, wherein the opposing sidewalls of both the first and second fin, nanowire, or nanoribbon are tapered.

8. The integrated circuit structure of claim 1, wherein the opposing sidewalls of the first fin, nanowire, or nanoribbon are not collinear with the opposing sidewalls of the second fin, nanowire, or nanoribbon.

9. The integrated circuit structure of claim 1, wherein:
   the opposing sidewalls of both the first and second fin, nanowire, or nanoribbon are tapered;
   the opposing sidewalls of the first fin, nanowire, or nanoribbon are not collinear with the opposing sidewalls of the second fin, nanowire, or nanoribbon; and
   one of the opposing sidewalls of both of the first fin, nanowire, or nanoribbon and the second fin, nanowire, or nanoribbon is collinear with a corresponding one of the opposing sidewalls of the body.

10. The method of claim 9, wherein the first fin, nanowire, or nanoribbon is a fin, and the second fin, nanowire, or nanoribbon is a nanoribbon or nanowire.

11. The integrated circuit structure of claim 1, wherein the first transistor is a PMOS transistor and the second transistor is an NMOS transistor.

12. The integrated circuit structure of claim 1, wherein the integrated circuit structure is part of a computing system.

13. An integrated circuit structure, comprising:
    a body comprising one or more semiconductor materials and having a first width defined by a distance between opposing sidewalls of the body;
    a first transistor structure vertically over the body and including a first plurality of fins, nanowires, or nanoribbons, the first transistor structure including a first gate structure, a first source region, and a first drain region; and
    a second transistor structure vertically beneath the body and including a second plurality of fins, nanowires, or nanoribbons, the second transistor structure including a second gate structure, a second source region, and a second drain region;
    wherein one or more of the fins, nanowires, or nanoribbons of the first plurality has a second width, and one or more of the fins, nanowires, or nanoribbons of the second plurality has a third width, one or both of the second and third widths being at least 1.5 times less than the first width; and
    wherein the opposing sidewalls of the body are collinear with an outermost sidewall included in the first plurality of fins, nanowires, or nanoribbons and/or an outermost sidewall included in the second plurality of fins, nanowires, or nanoribbons.

14. The integrated circuit structure of claim 13, wherein one or both of the second and third widths is at least 2 times less than the first width.

15. The integrated circuit structure of claim 13, wherein the body includes first and second portions that are distinct from one another, and the one or more semiconductor materials of the body include a first semiconductor material in the first portion of the body and a second semiconductor material compositionally different from the first semiconductor material and in the second portion of the body, and wherein one or both of the first and second pluralities includes fins, nanowires, or nanoribbons are compositionally distinct from the body.

16. The integrated circuit structure of claim 13, wherein the outermost sidewall included in the first plurality of fins, nanowires, or nanoribbons is collinear with the outermost sidewall included in the second plurality of fins, nanowires, or nanoribbons.

17. The integrated circuit structure of claim 13, wherein the opposing sidewalls of the body are collinear with the outermost sidewall included in the first plurality of fins, nanowires, or nanoribbons and the outermost sidewall included in the second plurality of fins, nanowires, or nanoribbons.

18. The integrated circuit structure of claim 13, wherein one or both of the first and second pluralities includes fins.

19. The integrated circuit structure of claim 13, wherein the first plurality of fins, nanowires, or nanoribbons includes fins, and the second plurality of fins, nanowires, or nanoribbons includes nanowires or nanoribbons.

20. The integrated circuit structure of claim 13, wherein the integrated circuit structure is part of a processor or a communications chip.

21. An integrated circuit structure, comprising:
a body comprising one or more semiconductor materials and having a first width defined by a distance between opposing sidewalls of the body;
a first transistor above the body and including a first fin, nanowire, or nanoribbon, the first fin, nanowire, or nanoribbon having a second width defined by a distance between opposing sidewalls of the first fin, nanowire, or nanoribbon; and
a second transistor below the body and including a second fin, nanowire, or nanoribbon, the second fin, nanowire, or nanoribbon having a third width defined by a distance between opposing sidewalls of the second fin, nanowire, or nanoribbon;
wherein one or both of the second and third widths is at least 1.5 times less than the first width, wherein the body includes first and second portions that are distinct from one another, and the one or more semiconductor materials of the body include a first semiconductor material in the first portion of the body and a second semiconductor material compositionally different from the first semiconductor material and in the second portion of the body.

22. An integrated circuit structure, comprising:
a body comprising one or more semiconductor materials and having a first width defined by a distance between opposing sidewalls of the body;
a first transistor above the body and including a first fin, nanowire, or nanoribbon, the first fin, nanowire, or nanoribbon having a second width defined by a distance between opposing sidewalls of the first fin, nanowire, or nanoribbon; and
a second transistor below the body and including a second fin, nanowire, or nanoribbon, the second fin, nanowire, or nanoribbon having a third width defined by a distance between opposing sidewalls of the second fin, nanowire, or nanoribbon;
wherein one or both of the second and third widths is at least 1.5 times less than the first width, wherein the opposing sidewalls of both the first and second fin, nanowire, or nanoribbon are tapered.

23. An integrated circuit structure, comprising:
a body comprising one or more semiconductor materials and having a first width defined by a distance between opposing sidewalls of the body;
a first transistor above the body and including a first fin, nanowire, or nanoribbon, the first fin, nanowire, or nanoribbon having a second width defined by a distance between opposing sidewalls of the first fin, nanowire, or nanoribbon; and
a second transistor below the body and including a second fin, nanowire, or nanoribbon, the second fin, nanowire, or nanoribbon having a third width defined by a distance between opposing sidewalls of the second fin, nanowire, or nanoribbon;
wherein one or both of the second and third widths is at least 1.5 times less than the first width, wherein:
the opposing sidewalls of both the first and second fin, nanowire, or nanoribbon are tapered;
the opposing sidewalls of the first fin, nanowire, or nanoribbon are not collinear with the opposing sidewalls of the second fin, nanowire, or nanoribbon; and
one of the opposing sidewalls of both of the first fin, nanowire, or nanoribbon and the second fin, nanowire, or nanoribbon is collinear with a corresponding one of the opposing sidewalls of the body.

* * * * *